United States Patent
Lee et al.

(10) Patent No.: US 8,302,067 B2
(45) Date of Patent: Oct. 30, 2012

(54) PIN-OUT DESIGNATION METHOD FOR PACKAGE-BOARD CODESIGN

(75) Inventors: Ren-Jie Lee, Hsinchu (TW); Hung-Ming Chen, Hsinchu (TW)

(73) Assignee: National Chiao Tung University, Hsinchu (TW)

( * ) Notice: Subject to any disclaimer, the term of this patent is extended or adjusted under 35 U.S.C. 154(b) by 478 days.

(21) Appl. No.: 12/581,259

(22) Filed: Oct. 19, 2009

(65) Prior Publication Data

US 2011/0093828 A1    Apr. 21, 2011

(51) Int. Cl.
*G06F 17/50* (2006.01)

(52) U.S. Cl. ........................................ 716/137
(58) Field of Classification Search ............... 716/137
See application file for complete search history.

*Primary Examiner* — Vuthe Siek
*Assistant Examiner* — Aric Lin
(74) *Attorney, Agent, or Firm* — Alan Kamrath; Kamrath IP Lawfirm, PA

(57) ABSTRACT

A pin out designation method for package board codesign has steps of defining pin characteristics and requirements, generating multiple pin patterns, pin blocks construction and grouping and pin blocks floorplanning. Designers may use an EDA tool to generate multiple pin patterns and may use the pin patterns to construct multiple pin blocks, to group the pin blocks around four sides of a chip and to adjust the pin blocks into a minimized package size of the chip.

10 Claims, 17 Drawing Sheets

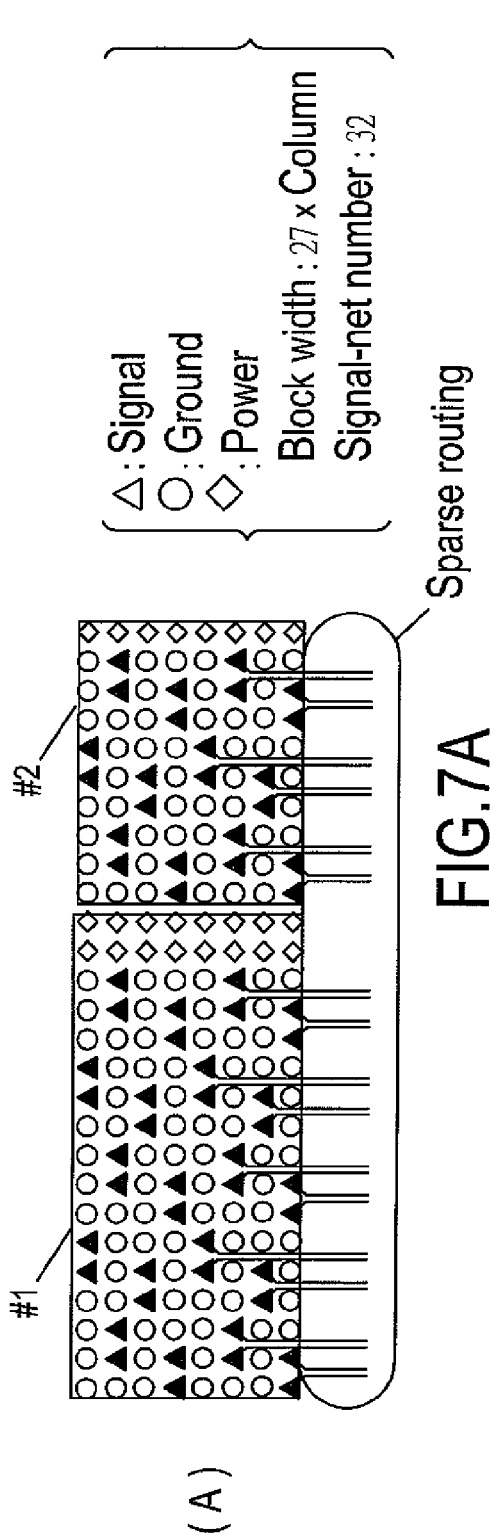
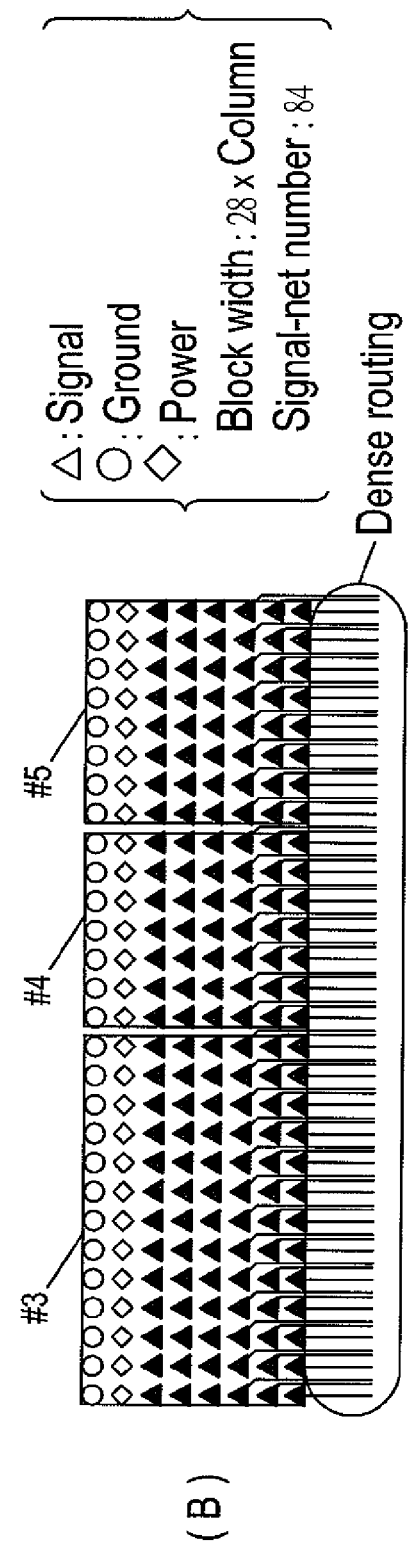
FIG.7A
FIG.7B

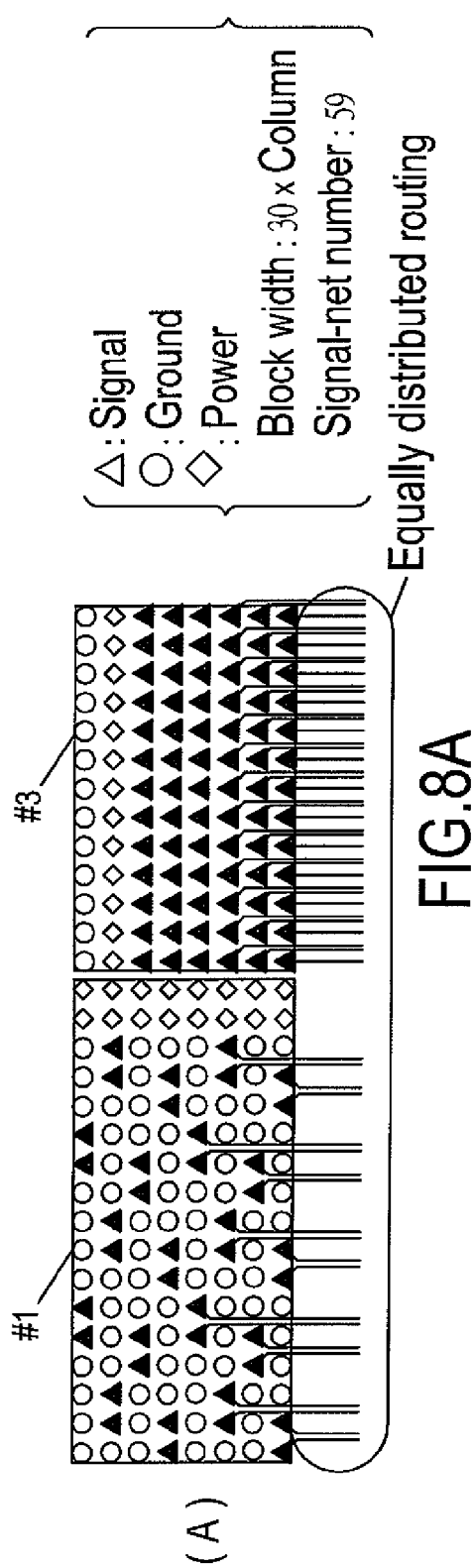
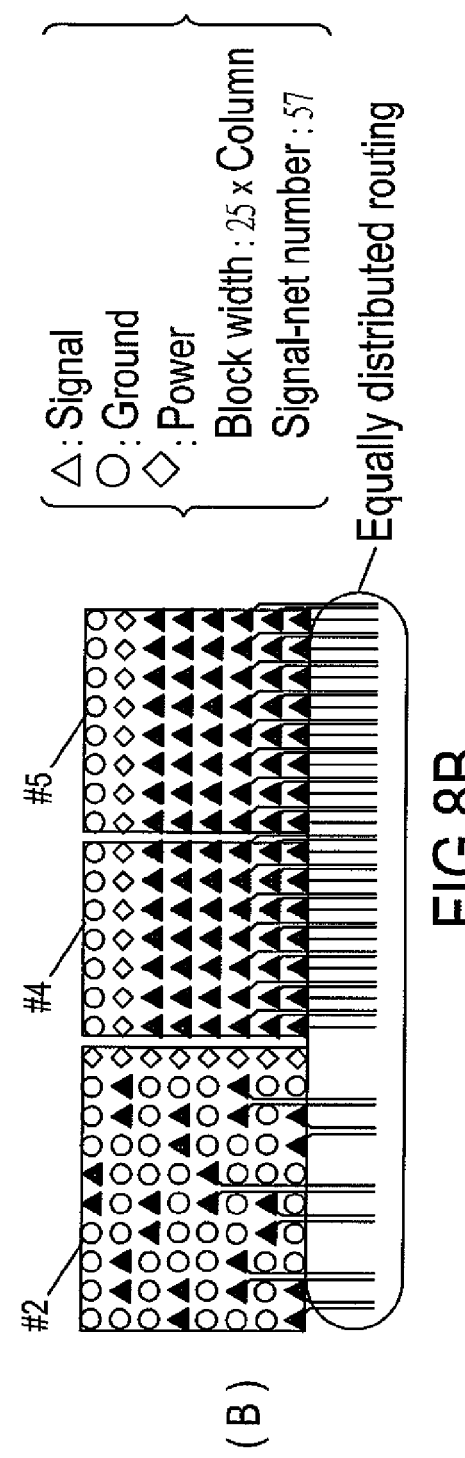
FIG.8A
FIG.8B

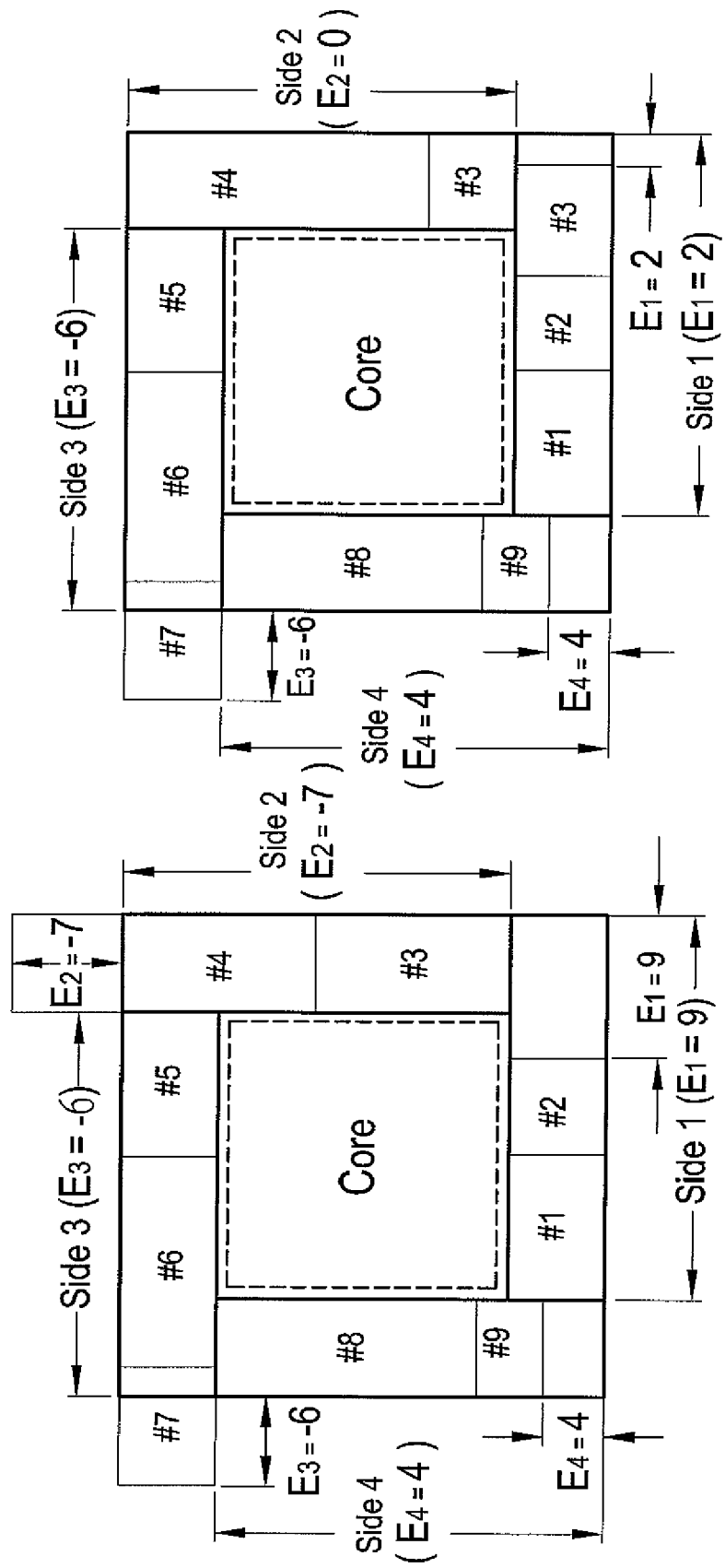

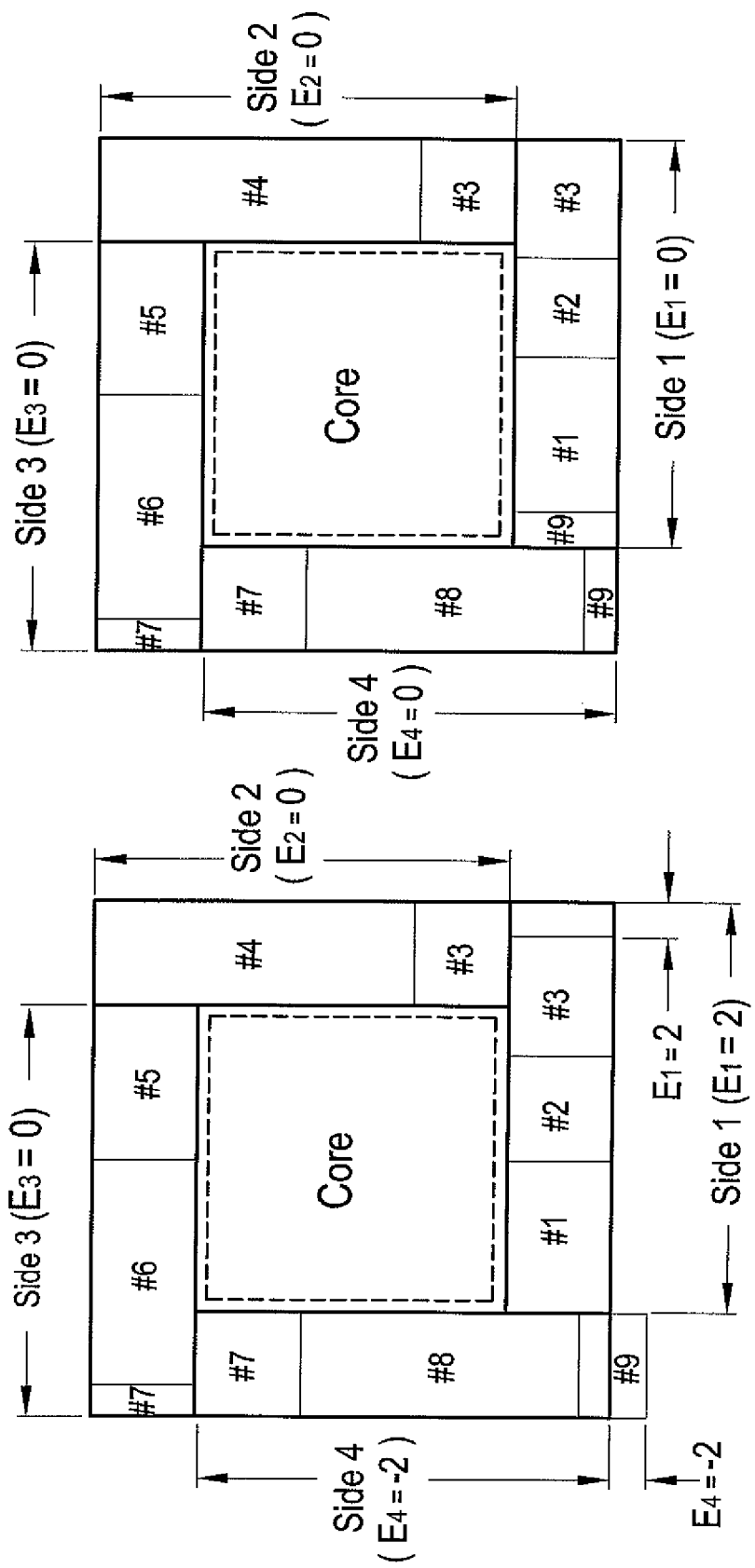

PIN-OUT DESIGNATION METHOD FOR PACKAGE-BOARD CODESIGN

BACKGROUND OF THE INVENTION

1. Field of Invention

The present invention relates to an integrated circuit chip pin-out designation method and, more particularly, to a pin-out designation method for package board codesign.

2. Description of the Related Art

Because of deep submicron (DSM) technology, chips now contain more functionality and are driven to higher performance levels. Consequently, with more functionality on the chip, designers have to deal with higher I/O densities, more signals coming out of a chip and tighter geometries. This complicates design of packaging which accommodates chips, as well as the board which accommodates the packages. As a result, designing the chip, the package and the surrounding system creates advantages, but is also challenging. Recently, chip-package codesign has created attention. However, packageboard codesign is definitely not trivial and still needs more development.

FIG. 11 shows a typical interface design flow for an integrated circuit (IC) package-printed circuit board (PCB) codesign. IC designers finish the pin designation based on experience (rule-of-thumb). In order to tradeoff signal performance and package cost, the designers always take a few weeks to modify package size, rework package substrate and PCB layout, and then rearrange the pin-out. This conventional process can not efficiently estimate an accurate package size during designating pins for a flip-chip BGA and can possibly degrade signal performance due to the weakness on product experience and basic design concept. Furthermore, these costly reworks constantly postpone launch schedules of chips, thus lengthening the time to market (TTM).

The present invention provides a pin-out designation method for package board codesign to obviate or mitigate the shortcomings of the conventional pin-out designation method.

SUMMARY OF THE INVENTION

The primary objective of the present invention is to provide a pin-out designation method for package board codesign that is automatic and fast and that retains signal quality.

A pin out designation method for a package board codesign has steps of defining pin characteristics and requirements, generating multiple pin patterns, pin blocks construction and grouping and pin blocks floorplanning. Designers may use an EDA tool that performs the pin out designation method to generate multiple pin patterns, may use the pin patterns to construct multiple pin blocks, may group the pin blocks around four sides of a chip and may adjust the pin blocks into a minimized package size of the chip.

Other objectives, advantages and novel features of the invention will become more apparent from the following detailed description when taken in conjunction with the accompanying drawings.

BRIEF DESCRIPTION OF THE DRAWINGS

FIGS. 7A and 7B is a first pin blocks arrangement example of a pin out of a chip;

FIGS. 8A and 8B is a first pin blocks arrangement example of a pin out of a chip;

FIGS. 9A to 9D are floorplanning examples for pin blocks of a chip;

DETAILED DESCRIPTION OF THE INVENTION

Figure 1A:
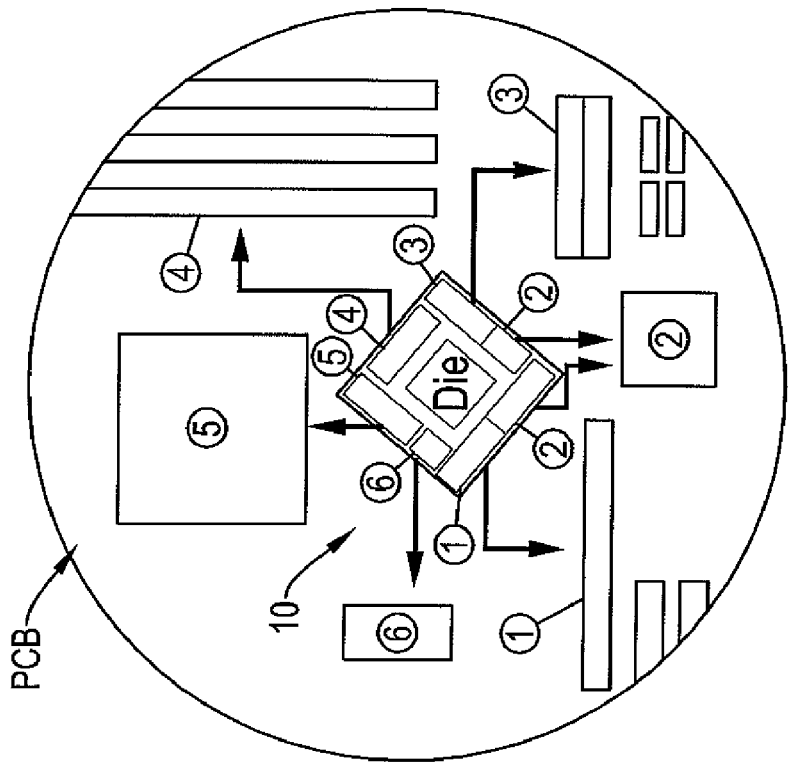
FIG. 1A is a top view of a first layout example of a chip on a printed circuit board (PCB)
Figure 1B:
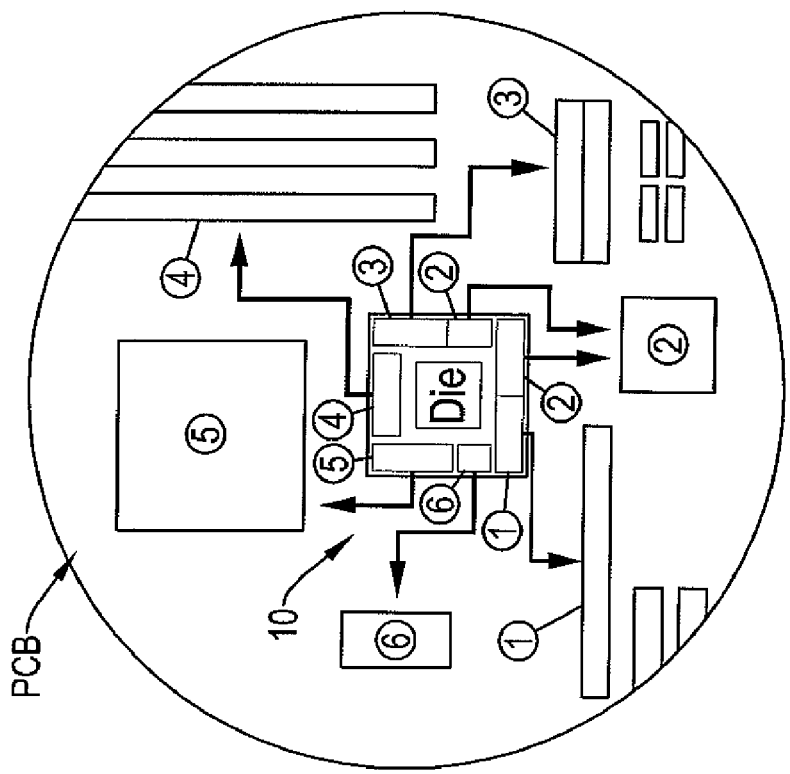
FIG. 1B is a top view of a second layout example of a chip on a printed circuit board (PCB)

With reference to FIGS. 1A and 1B, to understand the pin out designation method for a package board codesign in accordance with the present invention, considerations and critical constrains in designating a pin-out for a chip (10) are stated as follows.

I. Pin Out Designation by Considering Signal Integrity and Power Delivery in Package-Board Codesign When designating a pin-out, there are several critical constraints and considerations requiring care. A discussion is provided to introduce a design of a pin pattern which can take all the constraints and considerations into account.

A. Constraints and Considerations

1) Locations of PCB Components:

FIGS. 1A and 1B depict two sketches of two different PCB layouts that have different signal nets. Usually, a PCB contains several kinds of components and connectors (numbered as 1 to 5) which are applied to specific interfaces. A chip (10) is mounted between those components and connectors and has corresponding pin blocks (numbered as 1 to 5) that are respectively used for connecting with the components and connectors. The length of the signal net from each of the package pin blocks of the chip (10) to the corresponding component or connector on PCB is the primary contributor to parasitic inductance. Therefore, the location of the package pins of the chip (10) will exacerbate simultaneous switching noise (SSN) by increasing the parasitic inductance in a complex signal net, as shown as FIG. 1A. A familiar equation shown below describes the basic mechanism of SSN (VSSN):

$$V_{SSN} = NL_{tot}(dI/dt) \quad (1)$$

where N is the number of switching drivers, $L_{tot}$, is the equivalent inductance in which current must pass through, and I is the current per driver.

In order to minimize the physical length of the signal net and thus reduce the total parasitic inductance, package pins of the chip (10) should be accommodated in particular regions. As shown in FIG. 1B, the minimum net-length can be obtained by assigning the order of pin-blocks according to the certain location of corresponding components or connectors and, then, by fine-tuning the direction of package properly for the chip (10).

Figure 2:
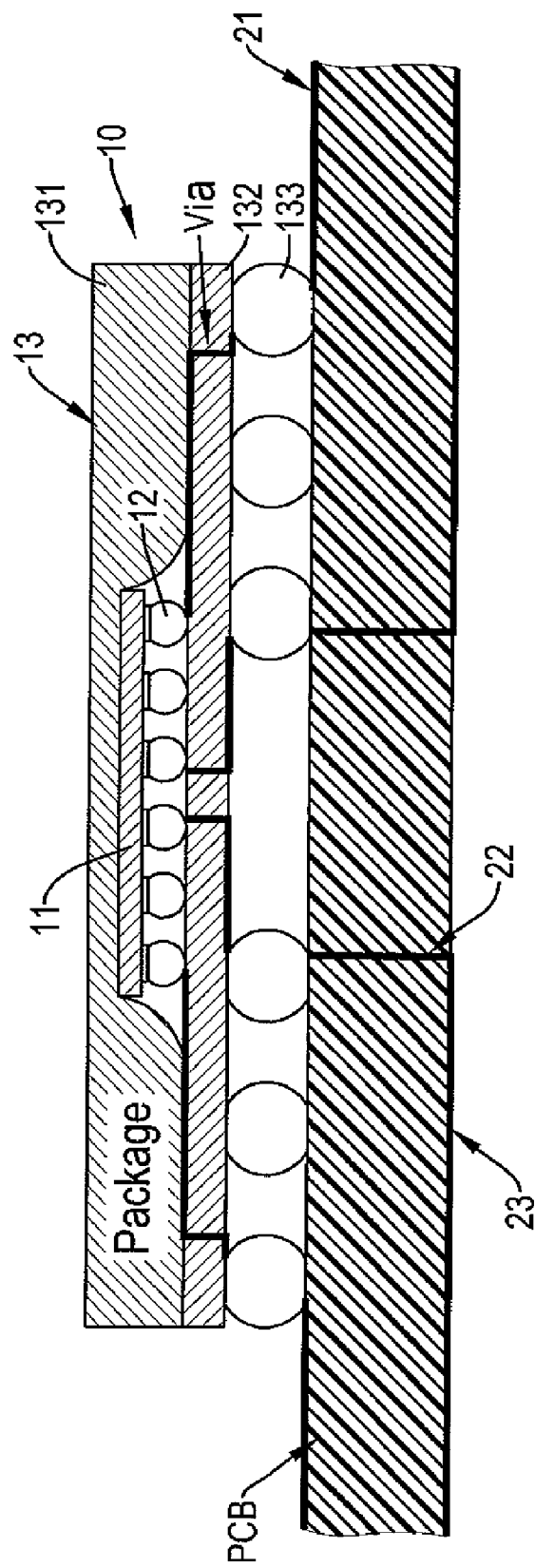
FIG. 2 is a perspective view in partial section of a chip on a PCB.
Figure 3A:
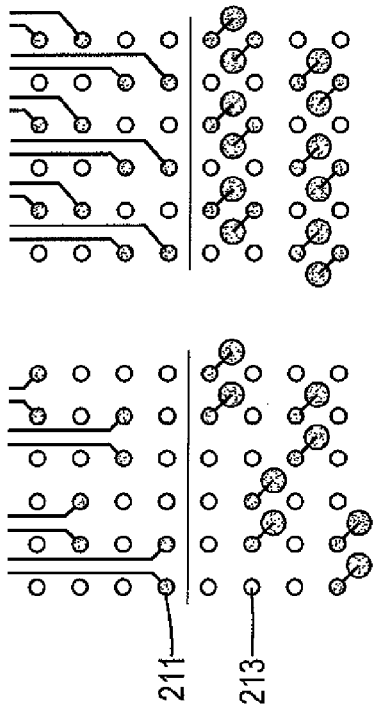
FIG. 3A is a layout example of a PCB.
Figure 3B:
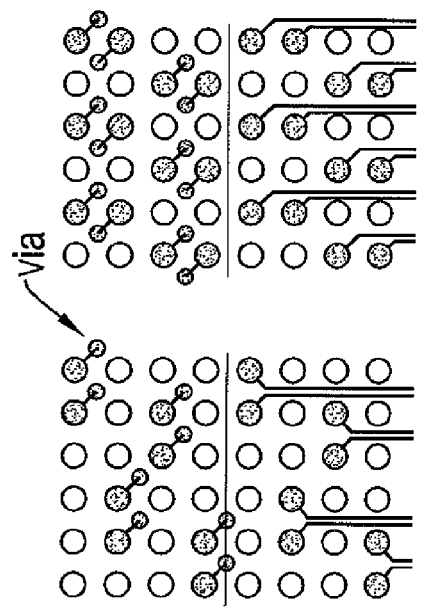
FIG. 3B is a layout example of a package substrate of a chip.
Figure 4:
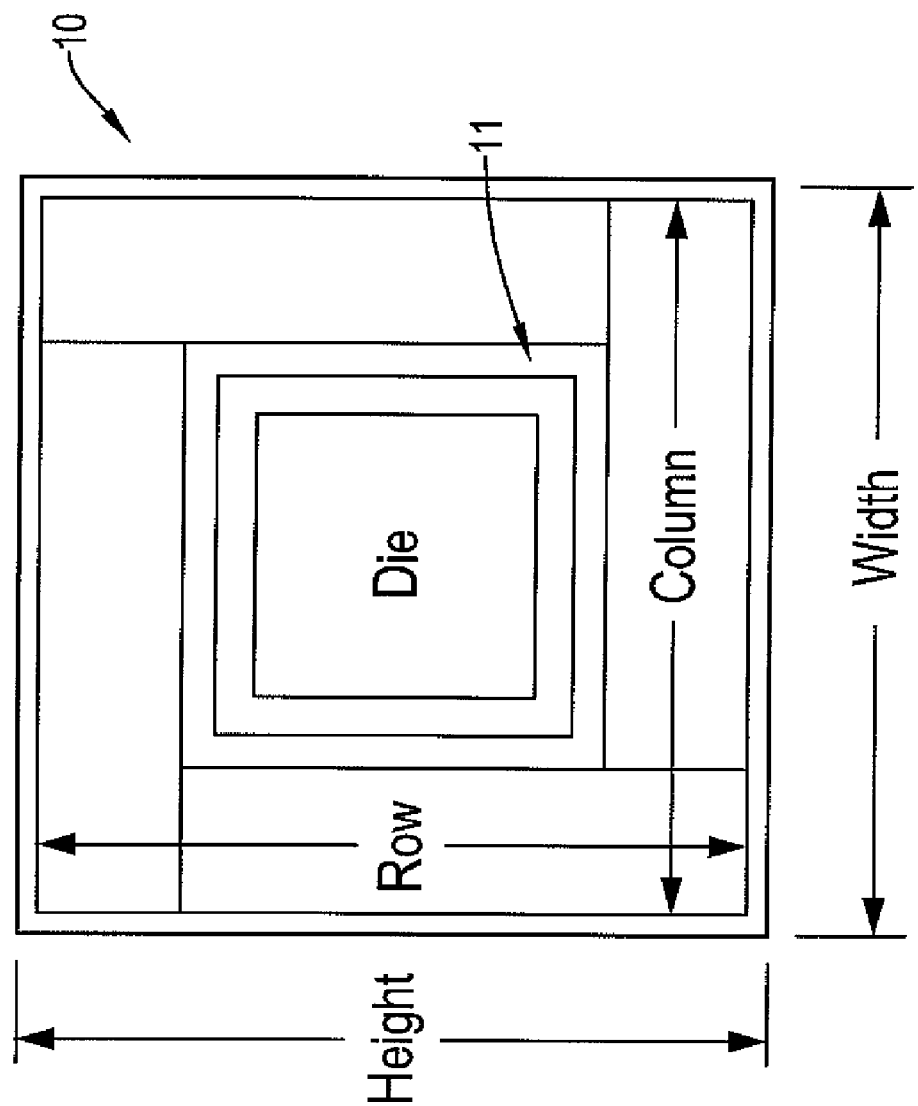
FIG. 4 is a top view of a chip.

2) Routability:

Another crucial factor of successful pin designation to the chip (10) considering the PCB layout is routability. For routing issues, an inflexible package-board of the chip (10) routing rules force the row number of signal pins, the signal net width and the spacing on the PCB to be critical constraints. FIG. 2 shows a simplified cross-section of the chip (10) with a flip-chip package (13) that is mounted on the PCB and that has a mold cap (131) and a package-board (132). The mold cap (131) is mounted on the package-board (132) to mount a die (11) therebetween. Based on rules of thumb, the package outer pins of the chip (10), such as solder balls (133), located close to edges of a package-board (132) connect solder bumps (12) through vias and package top layer routings on the package-board (132). These outer pins of the chip (10) are then routed on a PCB top layer network (21) of the PCB. On the other hand, package inner pins located around a core of the flip-chip package (13) connect solder bumps by package bottom layer routings of the package-board (132) and then are routed on a PCB bottom layer network (23) through PCB vias (22) of the PCB. FIGS. 3A and 3B demonstrate examples of a routing pattern on a top layer of the PCB and a routing pattern on a bottom layer of the package-board (132) respectively. Taking a diameter of the PCB pad is 14 mil (1 mil=25.4 um), the pad pitch is 39.37 mil, and the signal net width and the spacing are both 5 mil on a 4 layer PCB board as an example, the space between two pads can only be penetrated by two nets in this example. It means only three rows of signal pins can be fanned out on the nets on the top layer of PCB, as shown in FIG. 3B. Because of these routing rules, the excess row number of the signal pins will undoubtedly cause routing congestion due to the restricted area between the signal pins. FIG. 4 and Table 1 list the confined row number of the signal pins that are constant and independent of the package sizes. In the aforementioned example, the maximum row number of the outer pins is limited to nine and that of the signal pins is seven (this happens when the nets on the PCB bottom layer can be connected to those four rows of the signal pins of the chip (10)), even when package sizes are increased.

TABLE 1

| Package size (mm) | Pin number | Row number of outer-pin (power-pin, ground pin and signal pin) | | Row number of outer-pin (signal-pin only) | |
|---|---|---|---|---|---|
| (Width × Height) | (Row × Column) | Max. | Avg. | Max. | Avg. |
| 37.5 × 37.5 | 36 × 36 | 9 | 8 | 7 | 6 |
| 35 × 35 | 34 × 34 | 9 | 8 | 7 | 6 |
| 31 × 31 | 30 × 30 | 9 | 8 | 7 | 6 |
| 27 × 27 | 26 × 26 | 9 | 8 | 7 | 6 |
| ... | ... | 9 | 8 | 7 | 6 |

3) Signal Integrity: According to the routing pattern shown in FIGS. 3A and 3B, the rule of thumb in assigning pins to the chip (10) may be generalized. That is, if the signal pins are allocated on the same row, their nets can have balanced routing, which means these nets will have matched impedance on the PCB and package layout. On the other hand, if the signal pins are allocated on the same column, only some nets of the pins can have balanced routing. However, having matched impedance is an essential requirement for a high-speed differential system, since matched impedance may eliminate the common mode noise to improve the signal performance. For signal integrity reasons, a return path inductance is another main course. The unfavorable placement and number of return path pins, which are power or ground pins, will maximize current return loops and increase return path inductance. This will dramatically degrade signal integrity and exacerbate radiated emissions. Its mechanism is similar to that of SSN and has been shown in equation (1). In regard to crosstalk noise of the pins, one of the major mechanisms that cause crosstalk is mutual capacitance, since it will inject a current onto the neighbor victim pins. An induced noise ($I_{noise,Cm}$) is proportional to a mutual capacitance ($C_m$) and a rate in change of voltage on driven pins ($dV_{driver}/dt$):

$$I_{noise,Cm} = C_m (dV_{driver}/dt) \qquad (2)$$

Therefore, the optimal pin designation is to place the signal pin and the power or ground pins close to each other, so that each signal pin can be tightly coupled to a return path pin. This will minimize the effect of the return path inductance. Furthermore, if the signal pins are surrounded with the ground pins, the mutual capacitance will be decreased and the noise is extremely shielded.

B. Pin Pattern Design

In order to automatically and flexibly design an appropriate pin pattern to the chip (10) that is considering the PCB layout codesign, the design constraints discussed in section A are formulated as feasible ILP problems. Therefore, proper pin patterns may be achieved after solving the following Integer Linear Programming (ILP) problems:

$$p_{j,k} = \begin{cases} 1 & \text{for signal pins} \\ 0 & \text{for power/ground pins,} \end{cases} \forall PA_i \qquad (3)$$

$$\sum_{j=1}^{row} p_{j,k} \leq C_k, \forall PA_i, C_k \in N \qquad (4)$$

$$\sum_{k=1}^{col} p_{j,k} + p_{j,k+1} \leq D_j, \exists PA_i, D_j \in N \qquad (5)$$

$$\frac{SN_i}{col \cdot row - SN_i} \leq SRR_i, \forall PA_i \qquad (6)$$

$$\frac{p_{j,k}}{4 - (p_{j+1,k} + p_{j-1,k} + p_{j,k+1} + p_{j,k-1})} \leq SSR_i, \exists PA \qquad (7)$$

$$RPT_i = \begin{cases} 1 & \text{for using power pins} \\ 0 & \text{for using ground pins,} \end{cases} \forall PA_i \qquad (8)$$

wherein $SN_i (= \Sigma_{k=1}^{col} \Sigma_{j=1}^{row} p_{j,k})$ row and col are signal pin number per pattern, row number and column number of a pattern respectively.

Equation (4) is a signal pin capacity ($C_k$), which confines the signal pin number within a column for all patterns ($PA_i$). As the aforementioned discussion, the average number of the $PA_i$ is six.

Equation (5) is a differential signaling constraints ($D_j$). Differential signal pins in the pins of the chip (10) existing in specific patterns must be strictly assigned at adjacent locations in the same row (e.g., $p_{j,k}+1=1$, iff $p_{j,k}=1$).

Equation (6) is a ratio of the signal-to-return path pin ($SRR_i$) in the pins of the chip (10). Return path pins play an important role in signal integrity considerations, and designers must define this essential ratio for each pattern according to its applications.

Equation (7) is a ratio of the signal-to-shielding pin ($SSR_i$). For the purpose of isolating cross-talk noise, designers can set a higher ratio of the signal-to-shielding pin to assign the ground pin in the neighboring location of the signal pin. Otherwise, the ratio can be disregarded for low cost considerations. Obviously, these two ratios $SRR_i$ and $SSR_i$ will significantly trade off the performance and cost when designers are designing pin patterns for the chip (10).

Equation (8) is a type of the return path pin ($RPT_i$). Once the type of return path pin match that of a PCB reference plane, the return path will induce the lower parasitic inductance. Hence, this constraint should be defined along the type of reference plane (power/ground) on the PCB.

TABLE 2

|  |  | $C_k$ | $D_j$ | $SRR_i$ | $SSR_i$ | $RPT_i$ |
|---|---|---|---|---|---|---|
| Pattern 1 ($PA_1$) | $PA_{10}$ | 6 | 2 | ½ | ⅓ | 0 |
|  | $PA_{11}$ | 6 | 2 | ½ | ⅓ | 0 |
| Pattern 2 ($PA_2$) | $PA_{20}$ | 6 | 2 | ½ | ⅓ | 0 |
|  | $PA_{21}$ | 6 | N/A | 1 | ⅓ | 0 |
| Pattern 3 ($PA_3$) | $PA_{30}$ | 6 | N/A | 1 | ⅓ | 0 |
|  | $PA_{31}$ | 6 | 2 | ½ | ⅓ | 0 |
| Pattern 4 ($PA_4$) | $PA_{40}$ | 6 | N/A | 1 | ⅓ | 0 |
|  | $PA_{41}$ | 6 | N/A | 1 | ⅓ | 0 |
| Pattern 5 ($PA_5$) | $PA_{50}$ | 6 | N/A | 1 | ⅓ | 1 |
|  | $PA_{51}$ | 6 | N/A | 1 | ⅓ | 0 |
| Pattern 6 ($PA_6$) | $PA_{60}$ | 6 | N/A | 3 | N/A | 1 |
|  | $PA_{61}$ | 6 | N/A | 3 | N/A | 0 |

For two layers PCB routing, Table 2 proposes six sets of the aforementioned constraints for generating six options of signal pin patterns (where $PA_{i0}$ and $PA_{i1}$ represent the fore-half and back-half of each pattern, and i is the number of the patterns). Signal performance and package cost are traded off.

Figure 5A:
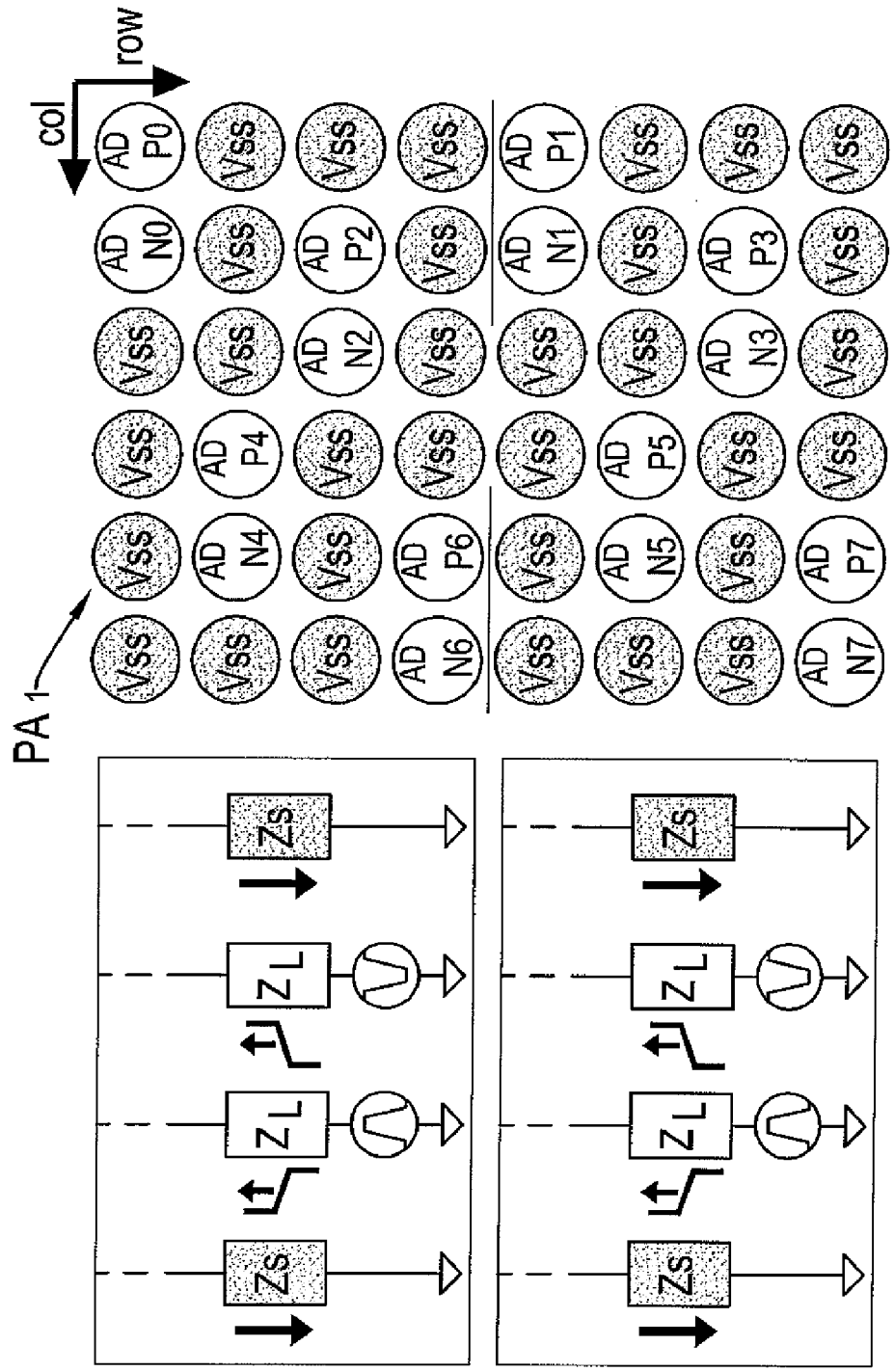
FIGS. 5A-5F are examples of pin patterns and equivalent circuits thereof.
Figure 5B:
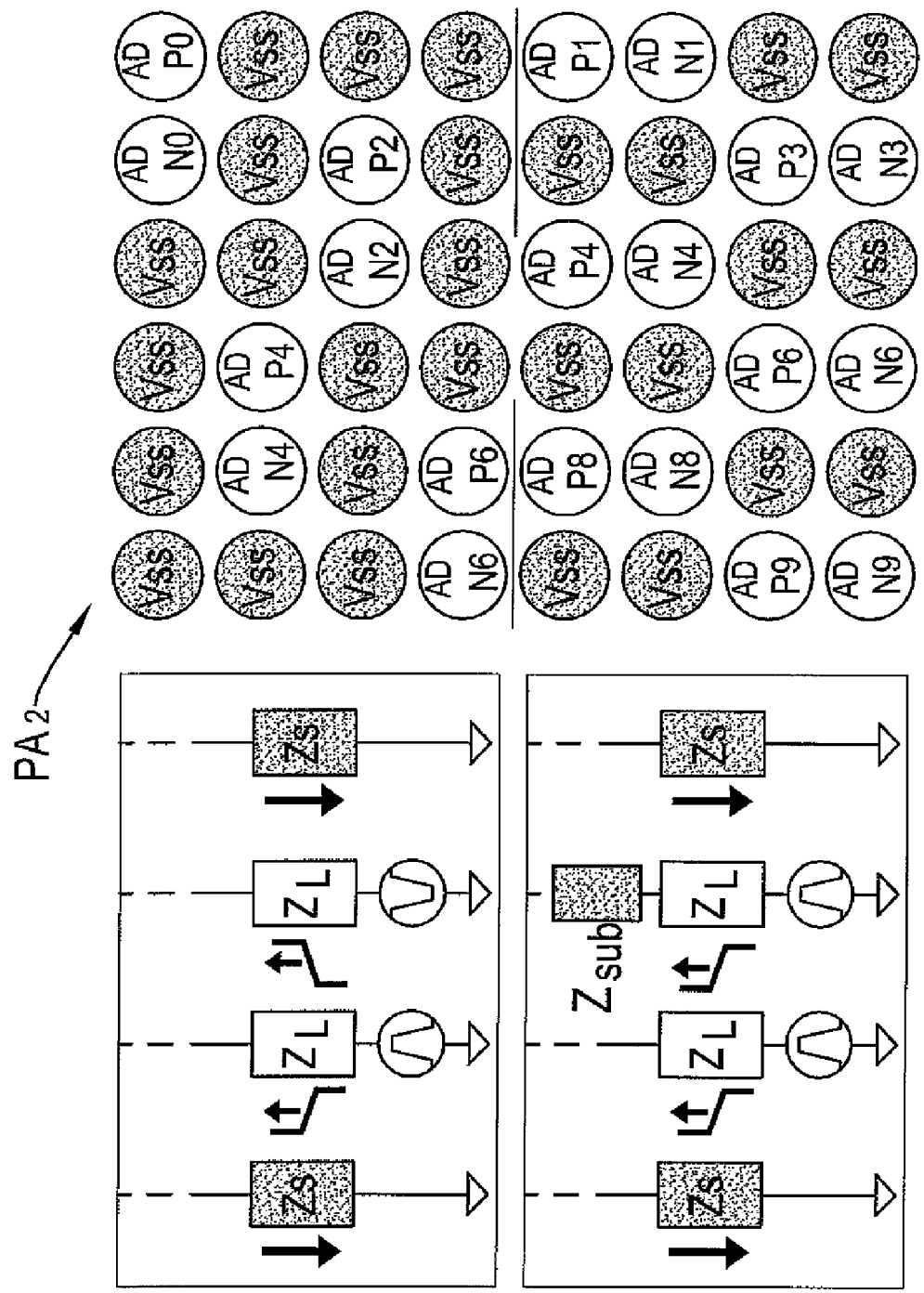
Figure 5C:
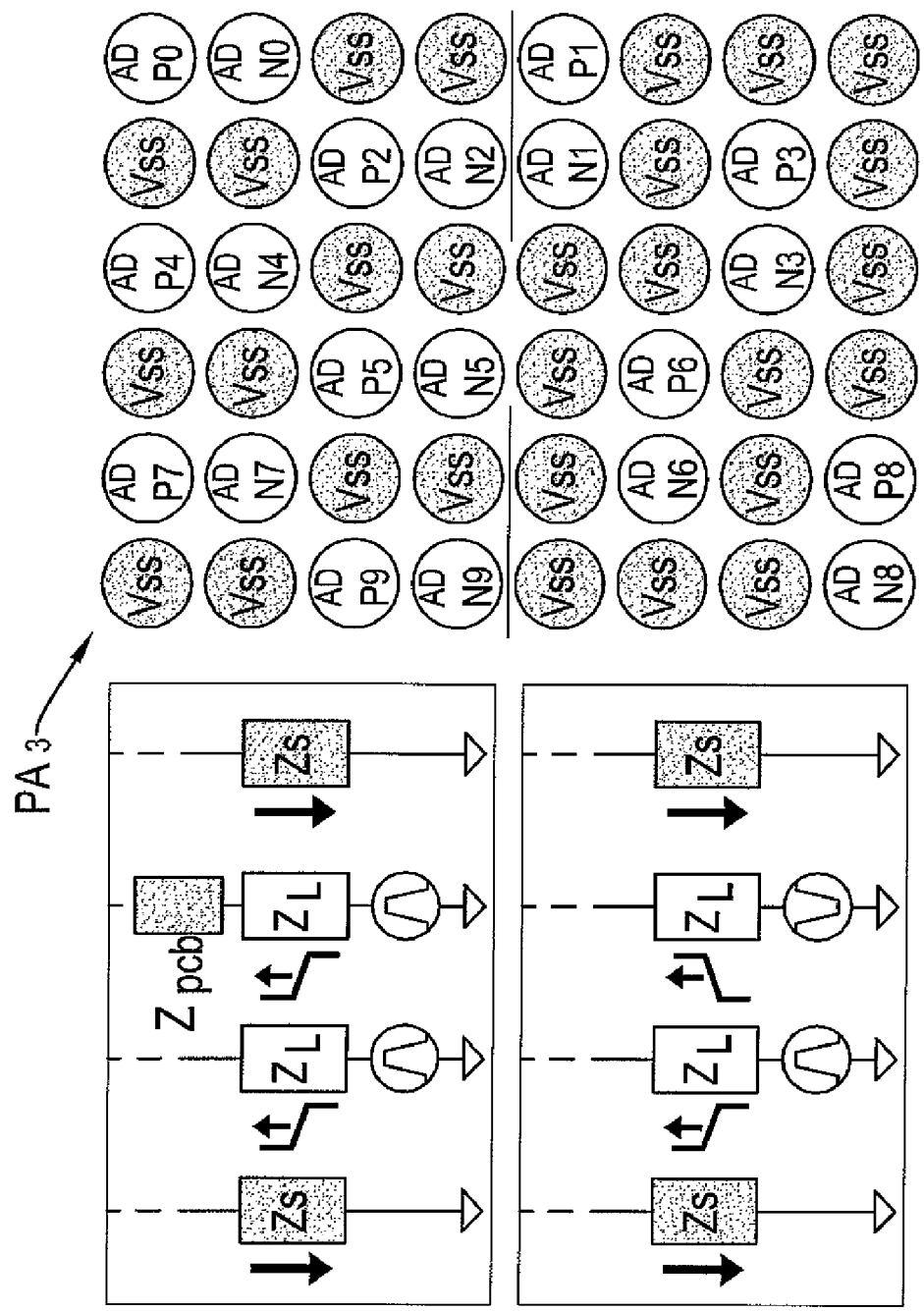
Figure 5D:
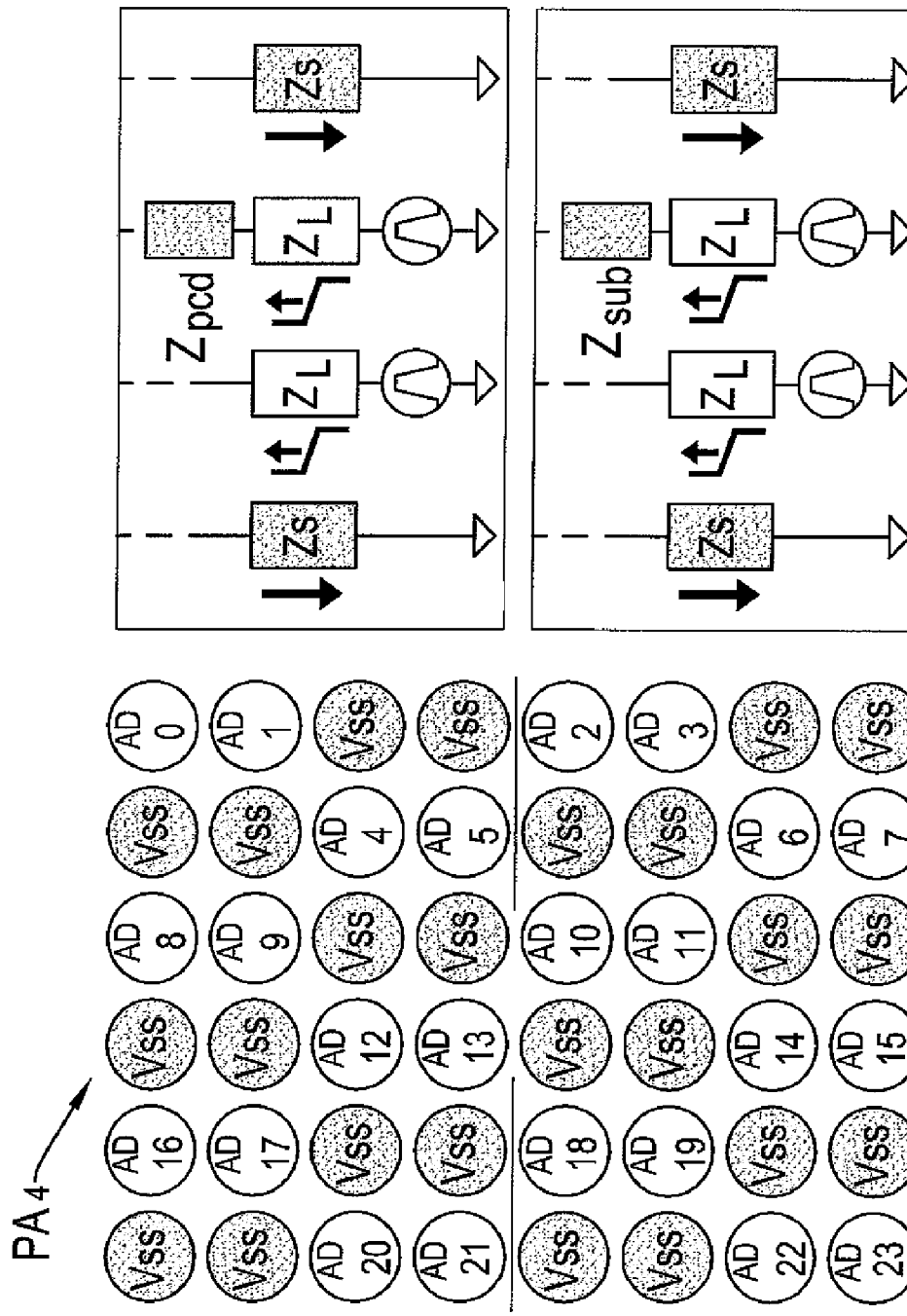
Figure 5E:
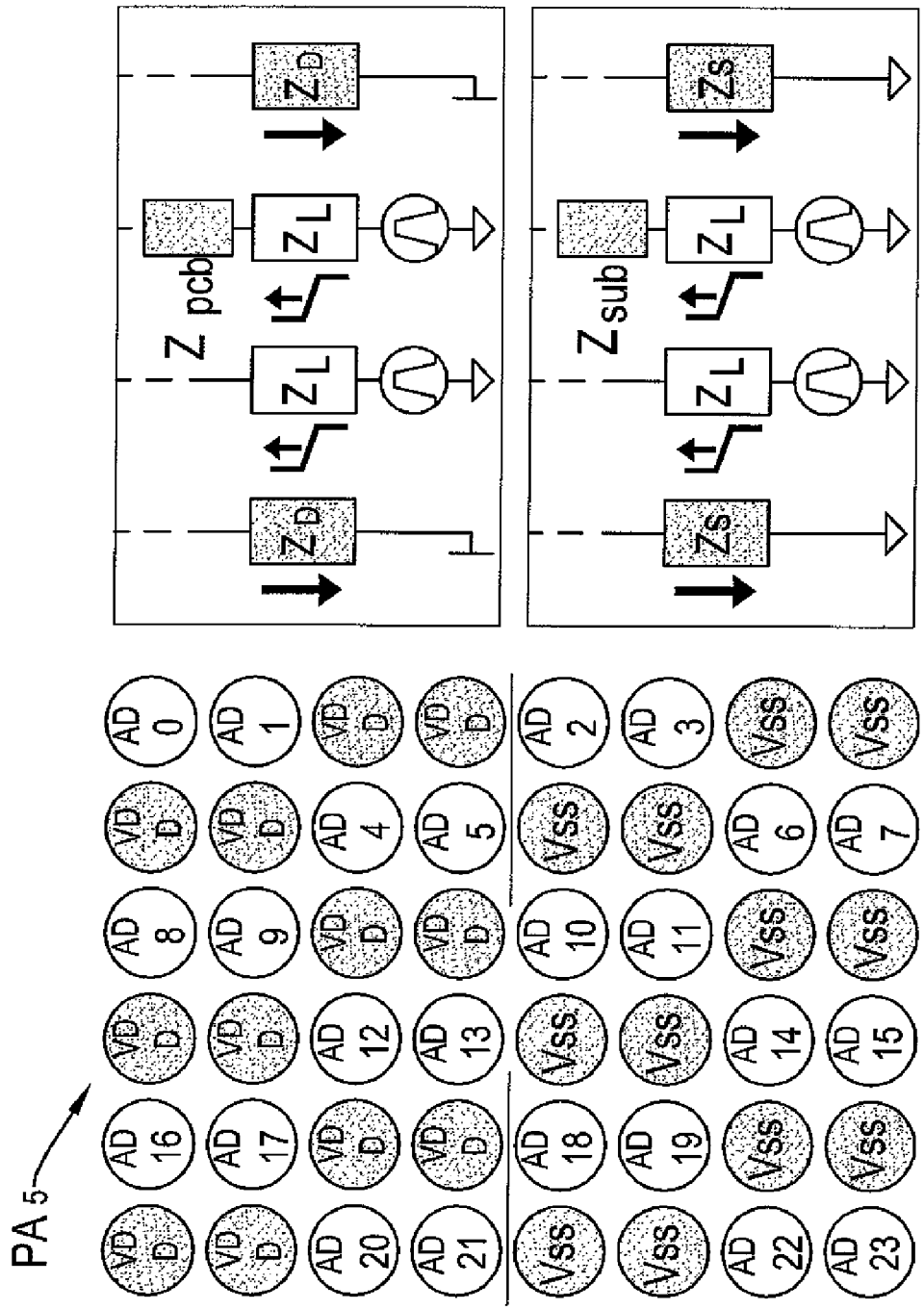

FIGS. 5A to 5F illustrate the proposed pin patterns and their corresponding simplified impedance models ($Z_L$=R+ $j\omega L$+1/$j\omega C$). The impedance of each net is composed of three components comprising a serial resistor(R), a serial inductor ($j\omega L$) and a shunt capacitor (1/$j\omega C$). The first signal-pin pattern ($PA_1$) depicts that each pair of differential signals has been surrounded by ground pins. The ground pins can be performed as adjacent return path pins to minimize total inductance and as shielding pins to isolate pin-to-pin crosstalk noise. Moreover, since the primary concern of a differential system is on impendence-matching of nets, the first pin pattern ($PA_1$) has an exclusive advantage of nets balancing on the PCB as well as the package substrate layout, shown in FIGS. 3A and 3B. Thus, the first pin pattern ($PA_1$) in FIG. 5A is optimal for differential signals from the performance perspective, and can be modeled by two nets with matched impedance $Z_L$, as shown in FIG. 5A. The only disadvantage of the first pin pattern is poor pin designation efficiency.

In most cases, if the return current of a signal pin flows on ground planes of the PCB, it should be coupled to the ground pins to result in a minimum return path, or vice versa. Whether a signal is coupled to just one power pin or just one ground pin, the signal pin will emerge from the particular signal type and its configuration. Therefore, fourth and fifth signal pin patterns are proposed in FIGS. 5D and 5E to provide two options for the specific bus, where the fifth pin pattern has better power delivery characteristics than the fourth because of the location of the power pins (for example, Vss) thereof. These two patterns arrange pins more efficiently than the first pattern, but they both have worse signal integrity on the PCB top-layer-routing and the package bottom-layer-routing due to poor impedance matching, shown in the right figures of FIGS. 3A and 3B. Hence, the net of each signal pair in its model has additional impedances except $Z_L$ on the PCB board ($Z_{pcb}$) or on the package substrate ($Z_{sub}$). Both of them include extra equivalent resistance, inductance and capacitance. As compared with the forementioned patterns, second and third patterns ($PA_2$, $PA_3$) are the compromises between signal performance and package cost.

Figure 5F:
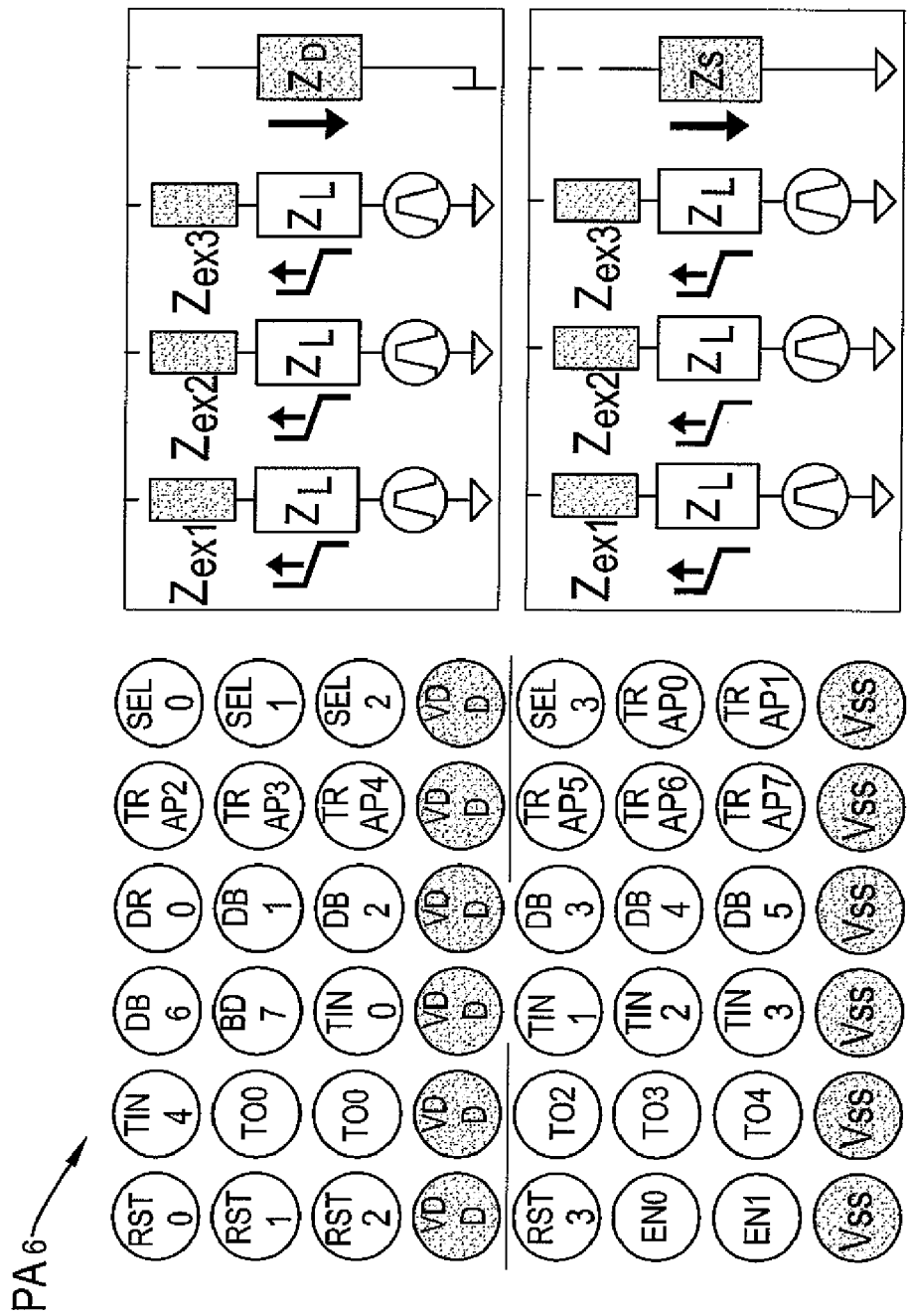

The sixth signal-pin pattern is the most efficient pin designation among all of the pin patterns since the sixth pin pattern contains more signal pins than other pin patterns. The major disadvantage of this pin pattern is that the six pin pattern ignores all signal integrity concerns and can only be applied to test-in, test-out or long pulse control signals, which have less sensitivity in crosstalk. Therefore, its impedance model in FIG. 5F depicts these characteristics by using undesirable and unpredictable impedance $Z_{ext}$ which is induced from the PCB board and the package substrate.

According to the experiences and basic concept of signal integrity, the proposed six pin patterns have been characterized and shown in Table 3 below.

TABLE 3

|  |  |  |  | Net Balance | | | | Signal shielding on | | | |
|---|---|---|---|---|---|---|---|---|---|---|---|
|  |  |  | Pin-to-pin | PCB | | Package Substrate | | package substrate (VDD/VSS) | | Power | Pin-designation |
|  | Application | Signal number | Crosstalk immunity | Top layer | Bottom layer | Top layer | Bottom layer | Top layer | Bottom layer | delivery aware | efficiency |
| Pattern 1 | Differential/ single end signal | 16 | Excellent | Good | Good | Good | Good | VSS | VSS | without | Not good |
| Pattern 2 | Differential/ single end signal | 20 | Good | Good | Good | Good | Not good | VSS | VSS | without | Average |
| Pattern 3 | Differential/ single end signal | 20 | Good | Not good | Good | Good | Good | VSS | VSS | without | Average |
| Pattern 4 | Differential/ single end signal | 24 | Excellent | Not good | Good | Good | Not good | VSS | VSS | without | Good |
| Pattern 5 | Differential/ single end signal | 24 | Excellent | Not good | Not good | Good | Not good | VDD | VSS | With | Good |
| Pattern 6 | Differential/ single end signal | 36 | Not good | Not good | Not good | Not good | Not good | None | None | With | Excellent |

During pin designation, designers can take these pin patterns as templates to easily choose a specific pattern along the specification of the individual bus. Moreover, designers can design pin patterns which have sensible efficiency, mutability and signal integrity for their specific purposes by defining their dedicated constraints.

II. Fast Pin-Out Designation Automation by Pin Block Construction and Floorplanning By using those pin patterns, the pin-blocks can be constructed and grouped for the pin-out designation, where each pin block is constructed from the pin patterns. In addition, the package size will be minimized by a pin-block floorplanning. The detailed strategies and methodologies to pin-blocks constructions, pin-block floorplanning and package size migration are further discussed hereunder.

A. Pin-Block Construction and Grouping

In conventional designing processes, designers always take half or one day to define the complete pin configuration for a high pin-count chip. The most precise pin configuration will contribute the optimal pin out and package size in manual design, but it is exhaustive and time-consuming work.

The long runtime of this manual job in the conventional method can be reduced by a rough pin configuration which simply contains four essential parameters: signal pin name, pin block placement sequence (order), selected signal-pin pattern and number of power-pins. An automatic simple pin block placement sequence is adopted. As long as a rough coordinate of each corresponding component on the PCB is obtained, the pin blocks placement sequence of the chip (10) will be determined by an intuitive manner of enumerating components clockwise (or counterclockwise). After that, designing the aforementioned pin patterns and selecting the appropriate pin pattern to pin blocks are then performed. According to the signal pin name and selected signal-pin pattern, signal pin designation for the chip (10) may be achieved automatically by locating signal pins within a corresponding block along the specific patterns.

Figure 6:
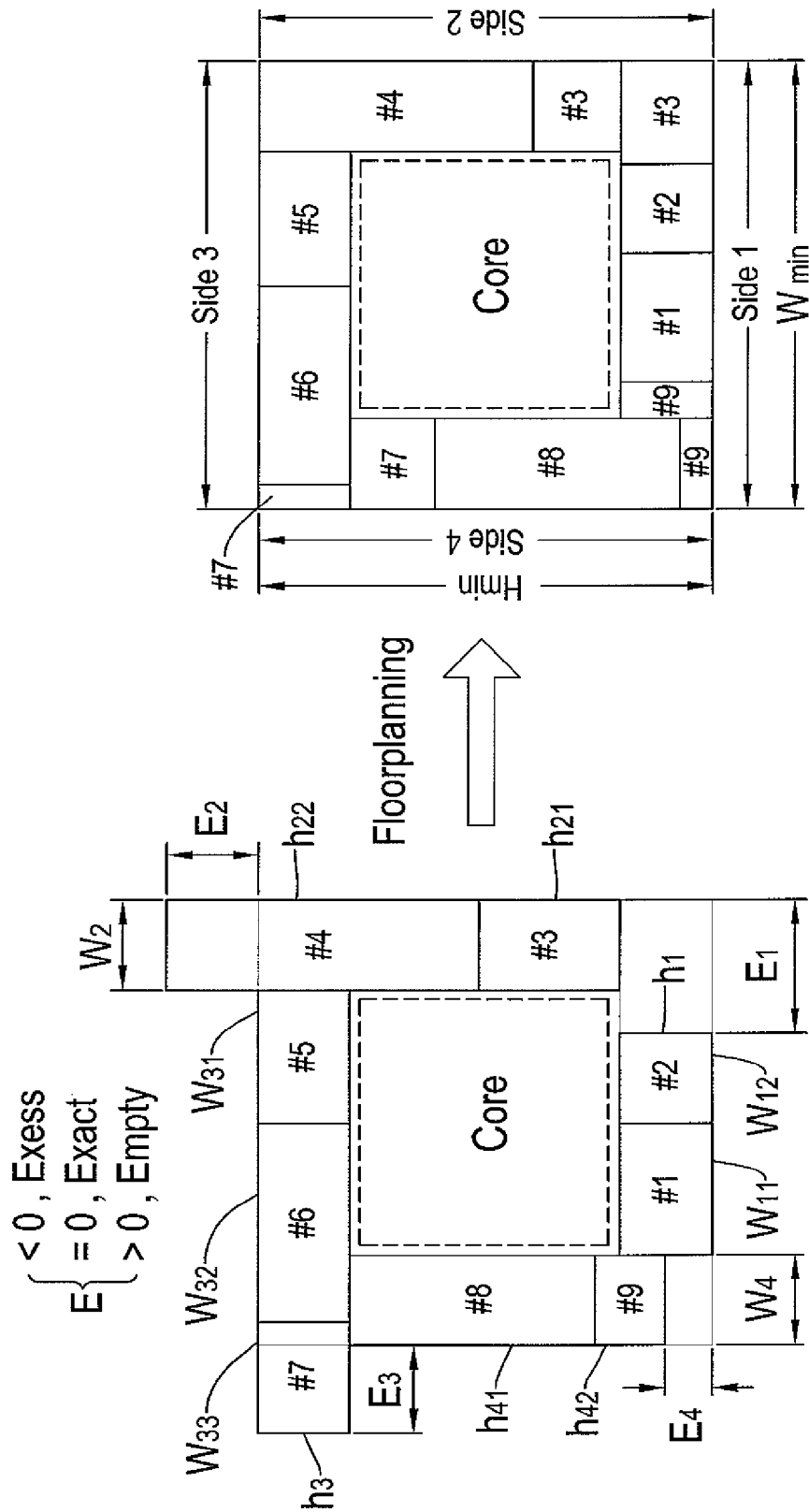
FIG. 6 is an example of floorplanning for pin blocks of a chip during pin out designation in accordance with the present invention.

The number of power pins can be used to deal with the power delivery issue. A strategy is proposed to establish a power-pin block which can provide a power channel on the PCB for various power domains. Designers can freely define the demand of power pins for the individual signal configuration relying on the power analysis result. While each signal pin block is constructed, a proposed automation approach will create a power pin block, place it adjacent to the related signal pin block and, then, integrate them into a single block for a signal bus. FIG. 6 shows an example where nine pin blocks (#1 to #9) are constructed for nine different interfaces (or components) on the PCB in a package. Finally, the pin block placement sequence is applied in pin block grouping strategies, which divide all pin blocks into four groups and place each on package sides (side 1 to side 4 in FIG. 6) in the next stage.

Two strategies are proposed for grouping pin blocks into package boundaries, which are a boundary-constrained pin-block grouping strategy (BCPG) and a congestion-free pin-block grouping strategy (CFPG). When designing a pin out for a chipset, because the chipset acts as a bridge of all components on the PCB (for example, a motherboard), the location of components is a major constraint. Since the locations of components on the PCB are boundary-constrained, the grouping strategy BCPG (shown in FIGS. 7A and 7B) will be applied. A safe range for the BCPG is proposed and is defined as Equation (9):

$$\psi 1 \cdot AV\ Gs \leq Sm \leq \psi 2 \cdot AV\ Gs \qquad (9)$$

wherein,
Sm is size of grouped pin block;
$\psi 1$ and $\psi 2$ are user defined parameters;
AV Gs=($\Sigma$n wn)=4 is an average pin block size; and
wn is width of each pin block.

Equation (9) shows that a main concern of this methodology is the pin block size. According to the pin block placement sequence determined in pin configuration, the pin blocks will be grouped into the single block in proper order until an integrated pin block size is located within a safe range. For the BCPG strategy, when the size of each pin block group is close to the average block size, a minimized Ei value results (empty indicator, shown in FIG. 6) on each side of the package. An empty space exists in a side of the package if the Ei is greater than zero. Therefore, the BCPG strategy will speed up a runtime of minimizing package size. However, the BCPG will introduce the possibility of generating a dense net-routing due to the disregard of the signal pin number. As shown in FIGS. 7A and 7B, the two pin block groups (one is grouped with block 1 and 2, the other is grouped with block 3, 4 and 5) have close pin block widths, but they have a very different signal net number. A worse example is shown in FIG. 7B, the pin block groups will decrease the routing efficiency on the PCB layout and increase the implementation cost for the PCB.

Another strategy is CFPG whose primary consideration is to equally distribute signal-pins on each package side. Consequently, the PCB layout will effortlessly lead to a loose density and have more flexibility to match the impedance of critical nets or adjust the location of components. FIGS. 8A and 8B shows an example, where the signal pins of integrated blocks will be close to each other when the CFPG strategy is adopted. Therefore, the CFPG strategy is suitable for the package design concerned with routability, such as a field programmable gate array (FPGA). Since the CFPG strategy will consider the signal pin number instead of the placement order or side of each pin block, the locations of the PCB components will be determined after it accomplishes the final pin out of the chip (10). A safe range used for the CFPG strategy is defined as follows:

$$\Psi 1 \cdot AV\ Gp \leq TPi \leq \Psi 2 \cdot AV\ Gp \qquad (10)$$

wherein,
TPi is a total signal pin number of grouped pin block;
$\Psi 1$ and $\Psi 2$ are user-defined parameters;
AV Gp=($\Sigma$j pj)=4 is the average signal-pin number; and
pj is the signal-pin number of each block.

Since the equalized signal pin number is usually larger than the size of grouped block, the CFPG must have a tighter safe range (e.g., $|\Psi 1-\Psi 2|<|\psi 1-\psi 2|$) to achieve the same boundary range as that of the BCPG. Since the pin block placement sequence will primarily be considered in BCPG, a first-fit heuristic algorithm which is an approximation algorithm for solving the bin-packing problem to group pin blocks may be used. The first-fit heuristic algorithm sequentially assigns objects into the first bin, and then creates a new bin when the current bin is full. In CFPG, a first prior consideration is to equalize the signal pin number. Hence, another bin packing approximation can be applied, such as, a best fit heuristic algorithm to group pin-blocks. The best fit heuristic algorithm ignores the order of objects and fills all objects into the feasible bins, which have the smallest residual capacity.

From the observations stated as above, signal integrity, power delivery and routability issues should be accounted for in general cases when signal pins are placed. After finishing the implementation and placement of all pin blocks, a rough pin designation can be obtained, shown in FIG. 6. At the same time, E1 to E4 can be evaluated from the rough pin designation (where E1 to E4 represent the width or height of the empty and excess area in each side of a minimum package to the chip (10)). These Ei values will be used for package size minimizing and pin block floorplanning.

B. Package Size Minimization and Pin-Block Floorplanning

The next step is to optimize package size and acquire a feasible pin designation. The objective function and constraints are formulated as a linear program and shown below:

Minimize:

$$f = \sum_{j=1,3}\left(\sum_i w_{ji} + E_j\right)h_j + \sum_{j=2,4}\left(\sum_i h_{ji} + E_j\right)w_j$$

subject to:

$$W_{min} = w_4 + \sum_i w_{1i} + E_1 = w_2 + \sum_i w_{3i} + E_3 \qquad (11)$$

$$H_{min} = h_1 + \sum_i h_{2i} + E_2 = h_3 + \sum_i h_{4i} + E_4 \qquad (12)$$

$$W_{min} \geq w_2 + w_4 + w_{Core} \qquad (13)$$

$$H_{min} \geq h_1 + h_3 + h_{Core} \qquad (14)$$

$$W_{min} = H_{min}; w_{Core} = h_{Core} \qquad (15)$$

$$E_1 + E_2 + E_3 + E_4 \geq 0 \qquad (16)$$

where $w_{1i}$, $h_1$, $h_{2i}$, $w_2$, $w_{3i}$, $h_3$, $h_{4i}$, $w_4$, can be evaluated in the pin block grouping, all shown in FIG. 6. The Core is the center area of a BGA package in FIG. 6. In principal, the power and ground pins are located at the center of the package, and a die is located upon these power and ground pins. As a result, the heat generated from the die can be transferred out through these pins.

Thus, increasing more power and ground pins located at the center area will improve heat dissipation, but enlarge the area of the Core, thereby enlarging the package size. To overcome this issue, Equation (13) to Equation (14) is used to define the area of Core in accordance with physical die size, where $w_{Core}$ and $h_{Core}$ in FIG. 6 are the designer's specified parameters. If these two values, $w_{Core}$ and $h_{Core}$, are not given by the designer, the minimum Core size can also be obtained when the minimum package size is evaluated. Constraint Equations (11), (12) and (15) will restrict the shape of the package to be square. The purpose of Equation (16) is to insure that the minimum package size can accommodate all pin blocks with almost no void pin positions.

After E1 to E4 are obtained, the position of the empty and excess areas in the minimized package size can be easily identified. A final step of the proposed methodology is to floor plan pin blocks, which split the pin blocks in the excess area and fill them into the adjacent empty area. It can completely eliminate excess area and can keep those pins located around the particular region restricted in the previous step. Proposed algorithm of the pin block floorplanning is shown below:

1) i←1, i∈1,2,3,4//start from side 1
2) i−1←4, iff i=1; i+1←1, iff i=4
3) repeat:
4) while ($E_i \neq \cap E_i < 0$) do
5) if $E_{i-1} > E_{i+1}$
6) shift pins clockwise//fill the pin-block into empty area in last side until the $E_i$ is zero
7) $E_i \leftarrow 0$, $E_{i-1} \leftarrow E_{i-1} + E_i$
8) else
9) shift pins counter clockwise//split the pin-block in excess area then group it into next side
10) $E_i \leftarrow 0$, $E_{i+1} \leftarrow E_{i+1} + E_i$
11) i←i+1//check next side
12) until all E value are larger than or equal to zero FIGS. 9A to 9D show a floorplanning example, where two excess areas occur in second and third sides (upper right (E2, belongs to pin block #4) and upper left (E3, belongs to pin block #7) corners in FIG. 9A) and two empty areas occur in first and fourth sides (bottom right (E1) and bottom left (E4) corners in FIG. 9A). According to the proposed algorithm, the pin blocks located in side 1 (comprises pin blocks #1 and #2) will be skipped due to E1>0 (line 4 in the above algorithm). While considering the pin blocks of side 2 in FIG. 9A, some of the pins in pin block group #3 will be clockwise filled into the empty area in side 1 (E1>E3, line 5 and 6), and then a next side (side 3) will be considered. In side 3 shown in FIG. 9B, the pins of pin block group #7 comprise an excess part extending outside the defined side of the minimized package, and the excess part will be split and grouped into side 4 (line 8 and 9) because E4>E2. Finally in the last side (side 4), the pins of pin block group #9 are the same case as that of the pin block #7 (FIG. 9C), will be floorplanned into proper locations and, then, acquire an optimized pin block floorplanning (FIG. 9D) through this simple procedure.

C. Dealing With Package Size Migration Issues

For practical applications, designers usually need to migrate package size from larger to smaller or vice-versa. During chip prototyping, the extra I/O pins are required for monitoring test signals, and then the package size will be dynamically migrated to a larger one. In addition, when the cost margin for improving performance or adding the new features is restricted, the chip size and package size must be enlarged simultaneously. These requirements can be satisfied easily by changing types of pin patterns from a higher SNi (signal-pin number per pattern) to lower one, which increases the width of the pin-blocks. On the contrary, when cost is less restricted than signal integrity, the die size can be shrunk due to the removal of some features, and the package size must be shrunk at the same time. Consequently, the types of pin pattern patterns should be modified from a lower SNi to a higher one, which increased the efficiency of pin designation but relaxes performance constraints to acquire smaller pin-blocks.

To tackle these package size migration issues, a migration factor (M.F.) is defined to evaluate the enlarged or shrunk column number (width) of pin-blocks during changing types of pin patterns. The migration factor can be calculated through the following equation:

$$M.F. = (-1) \cdot col \cdot \left(\frac{1}{SN_p} - \frac{1}{SN_m}\right) \qquad (17)$$

$$\Rightarrow \begin{cases} > 0 & \text{for enlarging package} \\ < 0 & \text{for shrinking package} \end{cases}$$

where col is the given column number of pin pattern, SNp and SNm are the signal pin number per pattern in previous pattern type and modified pattern type.

TABLE 4

|  | Pattern 1 | Pattern 2, 3 | Pattern 4, 5 | Pattern 6 |
| --- | --- | --- | --- | --- |
| Pattern 1 | N/A | −3/40 | −1/8 | −5/24 |
| Pattern 2, 3 | +3/40 | N/A | −1/20 | −2/15 |
| Pattern 4, 5 | +1/8 | +1/20 | N/A | −1/12 |
| Pattern 6 | +5/24 | +2/15 | +1/12 | N/A |

Table 4 shows the migration factors of the six patterns examples proposed above, where sign "+" means enlarged factor and sign "−" means shrinkage factor. Therefore, the total pin number of a group multiplied by the migration factor will estimate the modified width of a pin block. Then, the designer can decide which pattern should be modified along these estimations.

Figure 10:
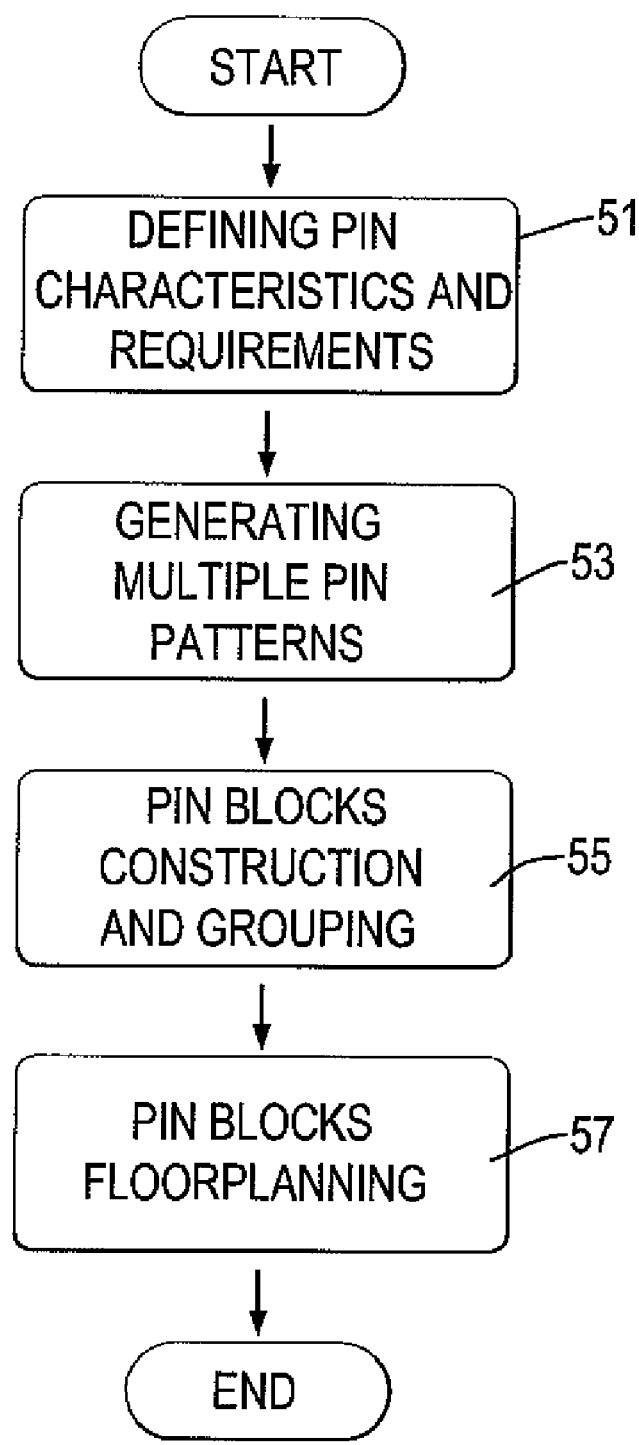
FIG. 10 is a flow chart of the pin out designation method for package board codesign in accordance with the present invention.
Figure 11:
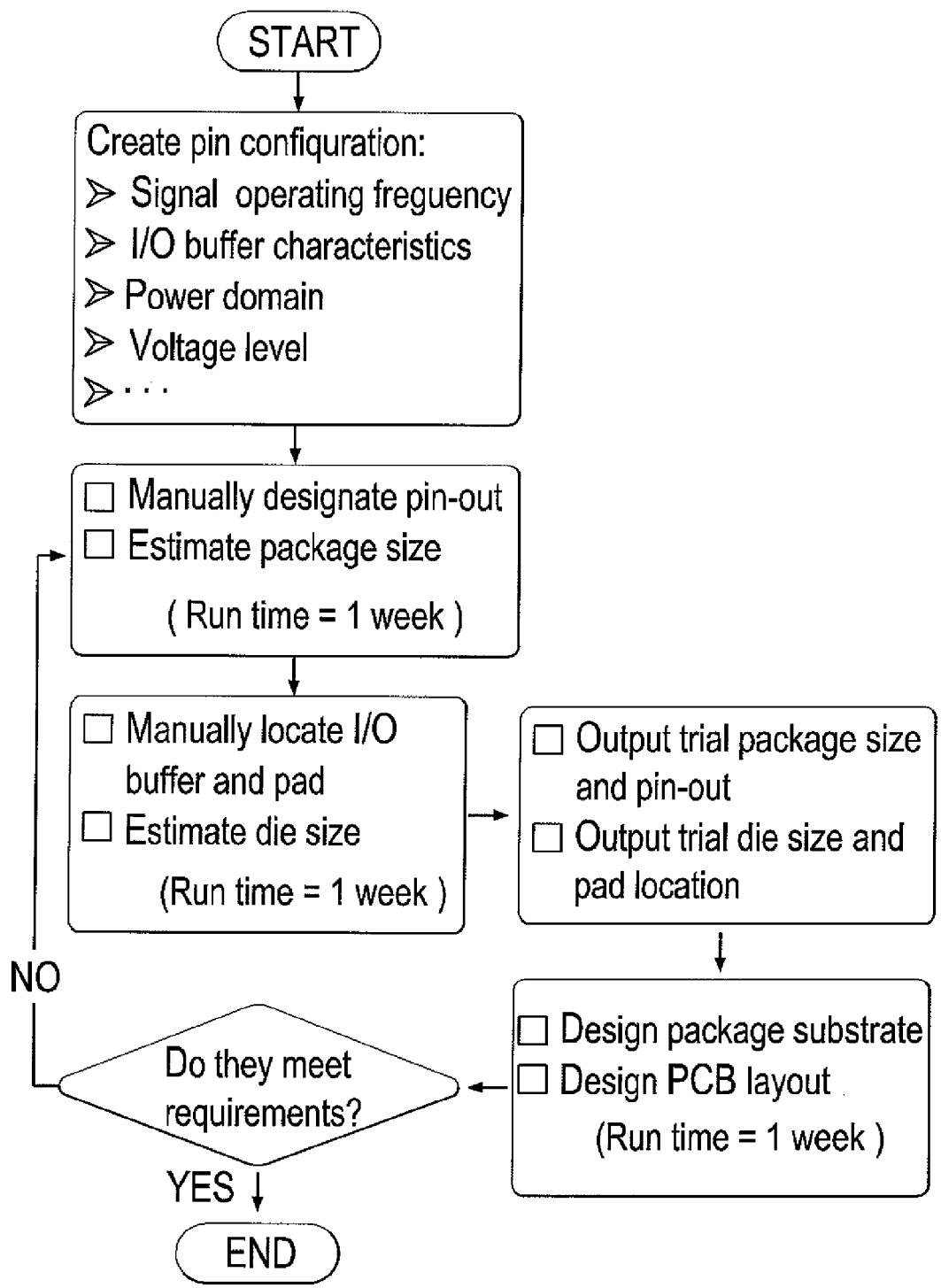
FIG. 11 is a design flow of a conventional pin out designation to a chip in accordance with the prior art.

In summary, a flow chart as shown in FIG. 10 relates to the pin out designation method for the package board codesign in accordance with the present invention. The pin out designation method for package board codesign may be coded as an Electronic design automation (EDA) program so a computer may perform the EDA program to finish the pin out designation for a chip automatically. The pin out designation method for package board codesign comprises the steps of: defining pin characteristics and requirements (51), generating multiple pin patterns (53), pin blocks construction and grouping (55) and pin blocks floorplanning (57).

In the step of defining pin characteristics and requirements (51), predefined characteristics and requirements for a chip that is designed to be mounted on a PCB are loaded or inputted. The characteristics and requirements may comprise location relations to the chip and components on the PCB, signal integrity of pins of the chip, pin names, pin numbers, power pin numbers and the like, which are disclosed as above Section I in detail. In the example of the pin out designation method for package board codesign coded as the EDA program, the program reads in or accepts to be defined the characteristics, requirements and constrains.

In the step of generating multiple pin patterns (53), the computer may solve the inputted characteristics, requirements and constrains with Integer Linear Programming (ILP) problems to generate multiple pin patterns (PAi). Each pin pattern is unique and comprises multiple signal pins and shield pins. The shield pins may be power pins or ground pins. The ILP problems are exampled as Equations (3) to (8) above.

In the step of pin blocks construction and grouping (55), the computer constructs multiple pin blocks using the pins patterns according to a rough pin configuration, where each pin block corresponds to and is used for connecting with a component on the PCB. The component may be an interface, a device, a chip set or the like. The predefined rough pin configuration comprises four parameters, which are signal pin name, pin blocks placement sequence (order), selected signal pin pattern and number of power pins. The required number pin blocks and pins configuration (such as, signal pin integrity, number of power pins and the like) in each pin block are determined when the layout of the components on the PCB are decided. Thus, each pin block is constructed based on the required signal pin name, the pin blocks placement sequence and the selected signal pin pattern. In the pin blocks placement sequence, each pin block is assigned a placement sequence (such as #1 to #9 in FIG. 6) so as to locate the pin block adjacent to a corresponding component of the PCB. The pin blocks placements sequence is applied according to pin block grouping strategies which divide the entire pin blocks for the components into four groups. The pin block grouping strategies are the aforementioned BCPG and CFPG strategies. The four pin block groups are successively located around four sides of the chip clockwise or counterclockwise, and the computer uses the BCPG or the CFPG strategies to perform the pin blocks grouping and, thus, let all the pin blocks be grouped into a single block in proper order until an integrated pin block size is located within a safe range. During grouping pin blocks, four size relation factors (Ei value, i ∈1,2,3,4) present size differences between the pin block groups at the four sides and the integrated pin block size. A, positive Ei value presents the size of the pin block group at a corresponding side is shorter than one of the sides of the integrated pin block size, and a negative Ei value presents the size of the pin block group is larger than a corresponding side of the integrated pin block size, as shown in FIG. 9A.

In the step of pin blocks floorplanning (57), the computer generates a linear program (Equations (11) to (16)) that is related to the size relation factor and minimizes the linear program to acquire the minimized integrated pin block size. Further, each pin block group is floorplanned by the computer to move an excess part of the pin block group into an adjacent empty area in an adjacent side of the integrated pin block.

As mentioned above, the present invention may automatically perform pin out designation to a chip by considering the layout and the location of components on the PCB. Thus, fast pin out designation is achieved since a designer may use an EDA program using the pin out designation method in accordance with the present invention to assign pin out to a chip automatically. Moreover, the signal quality is also considered during pin out designation in generating the pin patterns and the pin blocks.

Even though numerous characteristics and advantages of the present invention have been set forth in the foregoing description, together with details of the structure and function of the invention, the disclosure is illustrative only. Changes may be made in detail, especially in matters of shape, size and arrangement of parts within the principles of the invention to the full extent indicated by the broad general meaning of the terms in which the appended claims are expressed.

What is claimed is:

1. A pin out designation method for package board codesign, the method being performed by a computer and comprising:

defining pin characteristics and requirements of a chip;
generating multiple pin patterns of the chip;
constructing and grouping pin blocks; and
floorplanning pin blocks,
wherein:
in defining the pin characteristics and requirements of the chip, predefined characteristics and requirements for the chip are loaded into the computer, the chip is to be mounted on a printed circuit board (PCB) and surrounded by multiple components on the PCB, and the characteristics and requirements comprise location relationships between the chip and the multiple components on the PCB, signal integrity of pins of the chip, pin names, pin numbers and power pin numbers;
in generating multiple pin patterns of the chip, the computer solves loaded characteristics and requirements with an Integer Linear Programming (ILP) problem to generate multiple pin patterns (PAi), each pin pattern is unique and comprises multiple signal pins and shield pins, and the shield pins are power pins or ground pins;
in constructing and grouping the pin blocks, the computer constructs multiple pin blocks of the chip using the pin patterns according to a rough pin configuration,
wherein each pin block of the chip for connecting to a corresponding component on the PCB is constructed based on the characteristics and requirements and is adapted to be adjacent to the corresponding component of the PCB;

wherein the pin blocks of the chip are grouped as four pin block groups respectively located around four sides of the chip using a boundary-constrained pin-block grouping strategy (BCPG) or a congestion-free pin-block grouping strategy (CFPG), the four pin block groups are successively arranged around the four sides of the chip in a clockwise or counterclockwise direction, and the pin blocks are grouped as an integrated pin block until a size of the integrated pin block of the chip is located within a safe range;

wherein four size relation factors (Ei, i ∈ 1,2,3,4) are defined by the computer and each of the four size relation factors represents a size difference between one of the four pin block groups and the size of the integrated pin block; and wherein in floorplanning the pin blocks, the computer generates a linear program related to the four size relation factors and uses the linear program to acquire a size of a minimized integrated pin block; and wherein the pin block groups are floorplanned by the computer to move excessive parts of the pin block groups to neighboring empty areas adjacent to the excessive parts of the pin block group.

2. The pin out designation method for package board codesign as claimed in claim 1, wherein the ILP problem used for generating the pin patterns is $$p_{j,k} = \begin{cases} 1 & \text{for signal pins} \\ 0 & \text{for power/ground pins,} \end{cases} \forall PA_i \quad (3)$$

$$\sum_{j=1}^{row} p_{j,k} \leq C_k, \forall PA_i, C_k \in N \quad (4)$$

$$\sum_{k=1}^{col} p_{j,k} + p_{j,k+1} \leq D_j, \exists PA_i, D_j \in N \quad (5)$$

$$\frac{SN_i}{col \cdot row - SN_i} \leq SRR_i, \forall PA_i \quad (6)$$

$$\frac{p_{j,k}}{4 - (p_{j+1,k} + p_{j-1,k} + p_{j,k+1} + p_{j,k-1})} \leq SSR_i, \exists PA_i \quad (7)$$

$$RPT_i = \begin{cases} 1 & \text{for using power pins} \\ 0 & \text{for using ground pins,} \end{cases} \forall PA_i \quad (8)$$

wherein, $SN_1 (=\Sigma_{k=1}^{col}\Sigma_{j=1}^{row} p_{j,k})$, row and col respectively represent a signal pin number per pin pattern, a row number and a column number of a pin pattern;

equation (4) is a signal pin capacity ($C_k$), which confines the signal pin number within a column for all pin patterns (PAi);

equation (5) is differential signaling constraints (Dj), and the differential signal pins in the pins of the chip existing in specific patterns are strictly assigned at adjacent locations in the same row;

equation (6) is a ratio of signal-to-return path pin (SRRi) in the pins of the chip;

equation (7) is a ratio of signal-to-shielding pin (SSRi), for isolating cross-talk noise; and equation (8) is a type of return path pin ($RPT_i$).

3. The pin out designation method for package board codesign as claimed in claim 2 wherein the safe range for the BCPG is defined equation (9):

$$\psi 1 \cdot AV\, Gs \leq Sm \leq \psi 2 \cdot AV\, Gs \quad (9)$$

wherein,

Sm is a size of pin block groups;

$\psi 1$ and $\psi 2$ are user-defined parameters;

$AV\, Gs = (\Sigma n\, wn) = 4$ is an average pin block size; and wn is a width of each pin block.

4. The pin out designation method for package board codesign as claimed in claim 3, wherein the minimized integrated pin block has a core area, a first side, a second side, a third side, a fourth side, a width and a height, and the linear program in floorplanning the pin blocks is as follows:

Minimize:

$$f = \sum_{j=1,3}\left(\sum_i w_{ji} + E_j\right)h_j + \sum_{j=2,4}\left(\sum_i h_{ji} + E_j\right)w_j$$

subject to:

$$W_{min} = w_4 + \sum_i w_{1i} + E_1 = w_2 + \sum_i w_{3i} + E_3 \quad (11)$$

$$H_{min} = h_1 + \sum_i h_{2i} + E_2 = h_3 + \sum_i h_{4i} + E_4 \quad (12)$$

$$W_{min} \geq w_2 + w_4 + w_{Core} \quad (13)$$

$$H_{min} \geq h_1 + h_3 + h_{Core} \quad (14)$$

$$W_{min} = H_{min}; w_{Core} = h_{Core} \quad (15)$$

wherein the parameters used in equations (11) to (15) are defined as follows:

$W_{min}$: the width of the minimized integrated pin block;

$H_{min}$: the height of the minimized integrated pin block;

$w_2$: a width of each pin block arranged at the second side of the minimized integrated pin block;

$w_4$: a width of each pin block arranged at the fourth side of the minimized integrated pin block;

$w_{1i}$: a width of each pin block arranged at the first side of the minimized integrated pin block, where the suffix "i" denotes different pin blocks;

$w_{3i}$: a width of each pin block arranged at the third side of the minimized integrated pin block, where the suffix "i" denotes different pin blocks;

$h_1$: of each pin block arranged at the first side of the minimized integrated pin block;

$h_3$: a height of each pin block arranged at the third side of the minimized integrated pin block;

$h_{2i}$: a height of each pin block arranged at the second side of the minimized integrated pin block, where the suffix "i" denotes different pin blocks;

$h_{4i}$: a height of each pin block arranged at the fourth side of the minimized integrated pin block, where the suffix "i" denotes different pin blocks;

$w_{core}$: a width of the core area of the minimized integrated pin block; and $h_{core}$: a height of the core area of the minimized integrated pin block.

5. The pin out designation method for package board codesign as claimed in claim 2, wherein the safe range for the CFPG is defined by equation (10):

$$\Psi 1 \cdot AV\, Gp \leq TPi \leq \Psi 2 \cdot AV\, Gp \qquad (10)$$

wherein
TPi is a total signal pin number of the pin block groups;
$\Psi 1$ and $\Psi 2$ are user-defined parameters;
AV $Gp = (\Sigma j\, pj) = 4$ is the average signal-pin number; and
pj is the signal-pin number of each block.

6. The pin out designation method for package board codesign as claimed in claim 5, wherein the minimized integrated pin block has a core area, a first side, a second side, a third side, a fourth side, a width and a height, and wherein the linear program in floorplanning the pin blocks is as follows:
Minimize:

$$f = \sum_{j=1,3}\left(\sum_i w_{ji} + E_j\right)h_j + \sum_{j=2,4}\left(\sum_i h_{ji} + E_j\right)w_j$$

subject to:

$$W_{min} = w_4 + \sum_i w_{1i} + E_1 = w_2 + \sum_i w_{3i} + E_3 \qquad (11)$$

$$H_{min} = h_1 + \sum_i h_{2i} + E_2 = h_3 + \sum_i h_{4i} + E_4 \qquad (12)$$

$$W_{min} \geq w_2 + w_4 + w_{Core} \qquad (13)$$

$$H_{min} \geq h_1 + h_3 + h_{Core} \qquad (14)$$

$$W_{min} = H_{min};\ w_{Core} = h_{Core} \qquad (15)$$

wherein the parameters used in equations (11) to (15) are defined as follows:
$W_{min}$: the width of the minimized integrated pin block;
$H_{min}$: the height of the minimized integrated block;
$w_2$: a width of each pin block arranged at the second side of the minimized integrated pin block;
$w_4$: a width of each pin block arranged at the fourth side of the minimized integrated pin block;
$w_{1i}$: a width of each pin block arranged at the first side of the minimized integrated pin block, where the suffix "i" denotes different pin blocks;
$w_{3i}$: a width of each pin block arranged at the third side of the minimized integrated pin block, where the suffix "i" denotes different pin blocks;
$h_1$: a height of each in block arranged at the first side of the minimized integrated pin block;
$h_3$: a height arranged at the third side of the minimized integrated pin block;
$h_{2i}$: a height of each pin block arranged at the second side of the minimized integrated pin block, where the suffix "i" denotes different pin blocks;
$h_{4i}$: of each pin block arranged at the fourth side of the minimized integrated pin block, where the suffix "i" denotes different pin blocks;
$w_{core}$: a width of the core area of the minimized integrated pin block; and
$h_{core}$: a height of the core area of the minimized integrated pin block.

7. The pin out designation method for package board codesign as claimed in claim 1, wherein the safe range for the BCPG is defined by equation (9):

$$\psi 1 \cdot AV\, Gs \leq Sm \leq \psi 2 \cdot AV\, Gs \qquad (9)$$

wherein,
Sm is a size of pin block groups;
$\psi 1$ and $\psi 2$ are user-defined parameters;
AV $Gs = (\Sigma n\, wn) = 4$ is an average pin block size; and
wn is a width of each pin block.

8. The pin out designation method for package board codesign as claimed in claim 7, wherein the minimized integrated, pin block has a core area, a first side, a second side a third side, a fourth side, a width and a height, and wherein the linear program in floorplanning the pin blocks is as follows:
Minimize:

$$f = \sum_{j=1,3}\left(\sum_i w_{ji} + E_j\right)h_j + \sum_{j=2,4}\left(\sum_i h_{ji} + E_j\right)w_j$$

subject to:

$$W_{min} = w_4 + \sum_i w_{1i} + E_1 = w_2 + \sum_i w_{3i} + E_3 \qquad (11)$$

$$H_{min} = h_1 + \sum_i h_{2i} + E_2 = h_3 + \sum_i h_{4i} + E_4 \qquad (12)$$

$$W_{min} \geq w_2 + w_4 + w_{Core} \qquad (13)$$

$$H_{min} \geq h_1 + h_3 + h_{Core} \qquad (14)$$

$$W_{min} = H_{min};\ w_{Core} = h_{Core} \qquad (15)$$

wherein the parameters used in equations (11) to (15) are defined as follows:
$W_{min}$: the width of the minimized integrated pin block;
$H_{min}$: the height of the minimized integrated pin block;
$w_2$: a width of each pin block arranged at the second side of the minimized integrated pin block;
$w_4$: a width of each pin block arranged at the fourth side of the minimized integrated pin block;
$w_{1i}$: a width of each pin block arranged at the first side of the minimized integrated pin block, where the suffix "i" denotes different pin blocks;
$w_{3i}$: a width of each pin block arranged at the third side of the minimized integrated pin block, where the suffix "i" denotes different pin blocks;
$h_1$: a height of each pin block arranged at the first side of the minimized integrated pin block;
$h_3$: a height of each pin block arranged at the third side of the minimized integrated pin block;
$h_{2i}$: a height of each pin block arranged at the second side of the minimized integrated pin block, where the suffix "i" denotes different pin blocks;
$h_{4i}$: a height of each pin block arranged at the fourth side of the minimized integrated pin block, where the suffix "i" denotes different pin blocks;
$w_{core}$: a width of the core area of the minimized integrated pin block; and
$h_{core}$: a height of the core area of the minimized integrated pin block.

9. The pin out designation method for package board codesign as claimed in claim 1, wherein the safe range for the CFPG is defined by equation (10):

$$\Psi 1\, AV\, Gp \leq TPi \leq \Psi 2 \cdot AV\, Gp \qquad (10)$$

wherein,
TPi is a total signal pin number of the pin block groups;
ψ1 and ψ2 are user-defined parameters;
$AV\, Gp = (\Sigma j\, pj)=4$ is the average signal-pin number; and
pj is the signal-pin number of each block.

10. The pin out designation method for package board codesign as claimed in claim 9, wherein the minimized integrated pin block has a core area, a first side, a second side, a third side, a fourth side, a width and a height, and wherein the linear program in floorplanning the pin blocks is as follows:

Minimize:

$$f = \sum_{j=1,3}\left(\sum_i w_{ji} + E_j\right)h_j + \sum_{j=2,4}\left(\sum_i h_{ji} + E_j\right)w_j$$

subject to:

$$W_{min} = w_4 + \sum_i w_{1i} + E_1 = w_2 + \sum_i w_{3i} + E_3 \qquad (11)$$

$$H_{min} = h_1 + \sum_i h_{2i} + E_2 = h_3 + \sum_i h_{4i} + E_4 \qquad (12)$$

$$W_{min} \geq w_2 + w_4 + w_{Core} \qquad (13)$$

$$H_{min} \geq h_1 + h_3 + h_{Core} \qquad (14)$$

$$W_{min} = H_{min};\ w_{Core} = h_{Core} \qquad (15)$$

wherein the parameters used in equations (11) to (15) are defined as follows:

$W_{min}$: the width of the minimized integrated pin block;
$H_{min}$: the height of the minimized integrated pin block;
$w_2$: a width of each pin block arranged at the second side of the minimized integrated pin block;
$w_4$: a width of each pin block arranged at the fourth side of the minimized integrated pin block;
$w_{1i}$: a width of each pin block arranged at the first side of the minimized integrated pin block, where the suffix "i" denotes different pin blocks;
$W_{3i}$: a width of each pin block arranged at the third side of the minimized integrated pin block, where the suffix "i" denotes different pin blocks;
$h_1$: a height of each pin block arranged at the first side of the minimized integrated pin block;
$h_3$: a height of each pin block arranged at the third side of the minimized integrated pin block;
$h_{2i}$: a height of each pin block arranged at the second side of the minimized integrated pin block, where the suffix "i" denotes different pin blocks;
$h_{4i}$: a height of each pin block arranged at the fourth side of the minimized integrated pin block, where the suffix "i" denotes different pin blocks;
$w_{core}$: a width of the core area of the minimized integrated pin block; and
$h_{core}$: of the core area of the minimized integrated pin block.

* * * * *